(12) United States Patent
Kawana et al.

(10) Patent No.: US 6,179,954 B1
(45) Date of Patent: Jan. 30, 2001

(54) APPARATUS AND METHOD FOR ETCHING PRINTED CIRCUIT BOARD

(75) Inventors: Eishiro Kawana; Kouichi Ishida, both of Kawasaki (JP)

(73) Assignee: Fujitsu Limited, Kawasaki (JP)

(*) Notice: Under 35 U.S.C. 154(b), the term of this patent shall be extended for 0 days.

(21) Appl. No.: 09/295,519

(22) Filed: Apr. 21, 1999

Related U.S. Application Data

(62) Division of application No. 08/754,941, filed on Nov. 25, 1996, now abandoned, which is a continuation of application No. 08/288,925, filed on Aug. 11, 1994, now abandoned.

(30) Foreign Application Priority Data

Feb. 16, 1994 (JP) ................................... 6-019515

(51) Int. Cl.[7] ........................................... B05C 5/00
(52) U.S. Cl. .......................... 156/345; 134/131; 134/199
(58) Field of Search ............................ 156/345; 216/92; 134/122 R, 72, 124, 131, 199

(56) References Cited

U.S. PATENT DOCUMENTS

| | | |
|---|---|---|
| 3,868,272 | 2/1975 | Tardoskegyi . |
| 5,002,627 | 3/1991 | Scheithauer et al. . |
| 5,071,508 | * 12/1991 | Scheithauer et al. ................ 216/85 |
| 5,228,949 | 7/1993 | Ketelhohn et al. . |

FOREIGN PATENT DOCUMENTS

| | | | |
|---|---|---|---|
| 2-128493 | * | 5/1990 | (JP) . |
| 4-48085 | | 2/1992 | (JP) . |
| 4-199592 | * | 7/1992 | (JP) . |
| 5-152721 | * | 6/1993 | (JP) . |

* cited by examiner

*Primary Examiner*—Thi Dang
(74) *Attorney, Agent, or Firm*—Armstrong, Westerman, Hattori, McLeland & Naughton

(57) ABSTRACT

An etching apparatus for etching a printed circuit board includes a transport mechanism for horizontally transporting a printed circuit board in a transporting direction so that a height of the printed circuit board during etching is kept at a transport position, a plurality of upper spray nozzles for injecting an etchant to a top surface of the printed circuit board transported by the transport mechanism, and a plurality of lower spray nozzles for injecting an etchant to a bottom surface of the printed circuit board. In the etching apparatus, a flow rate of the etchant injected to the top surface of the printed circuit board is made greater than a flow rate of the etchant injected to the bottom surface of the printed circuit board by an arrangement of the upper spray nozzles and the lower spray nozzles.

2 Claims, 20 Drawing Sheets

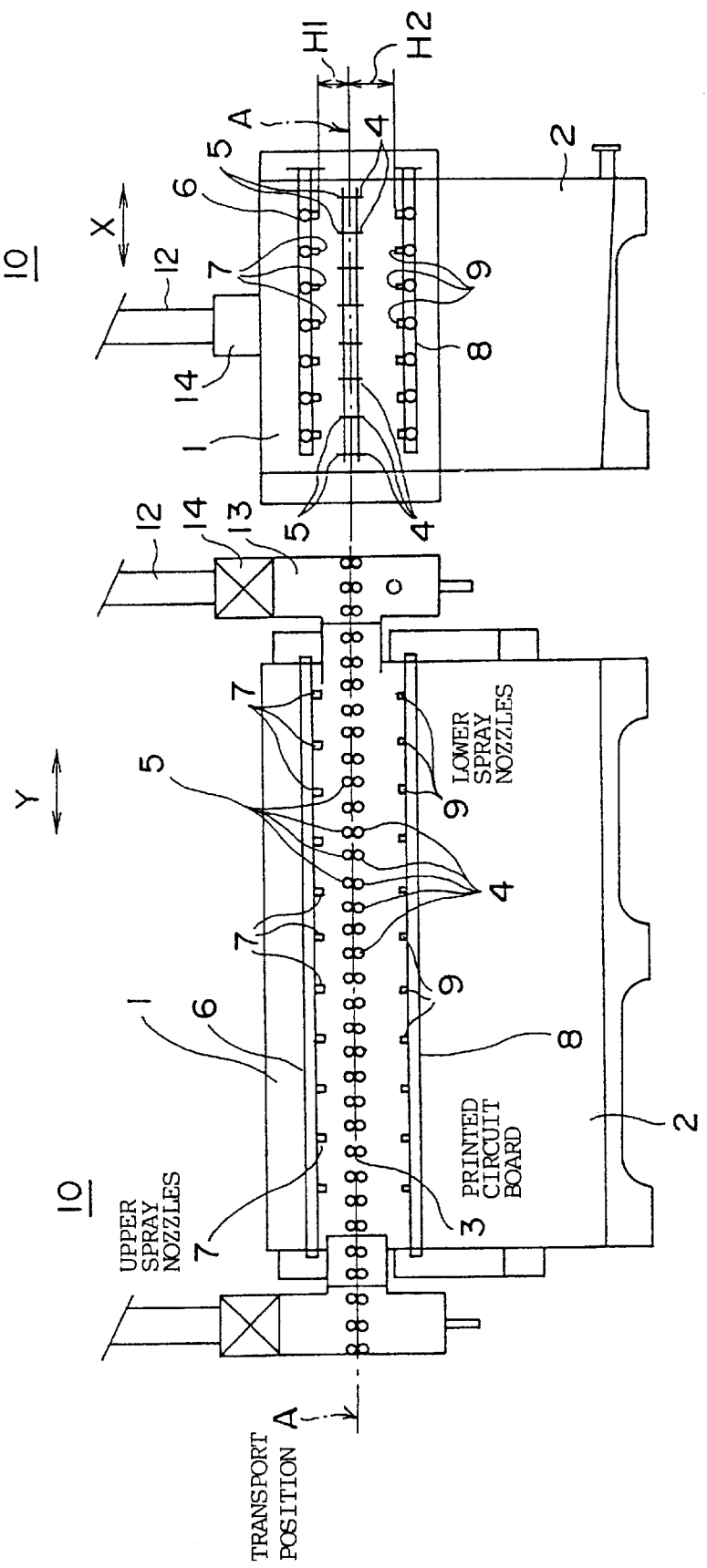

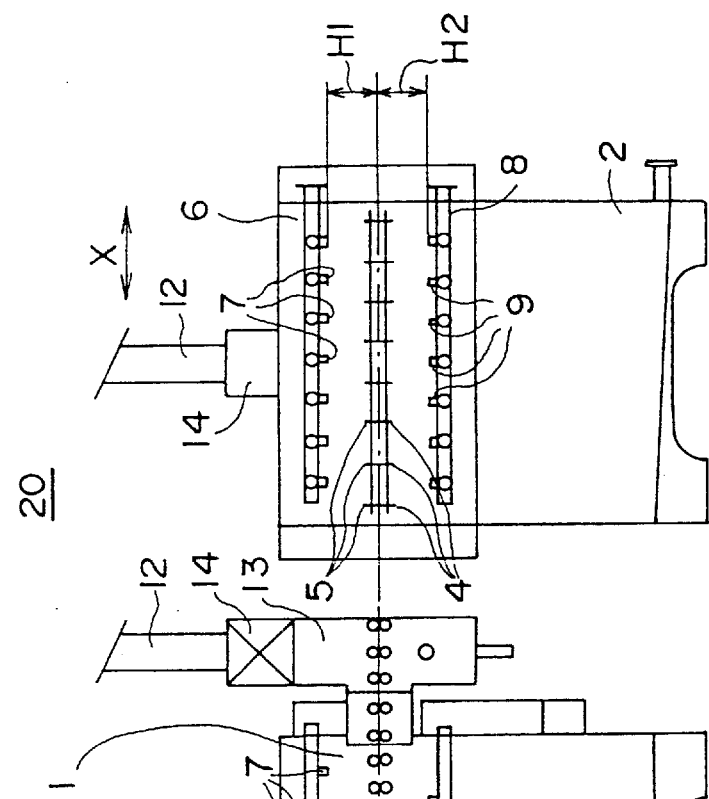
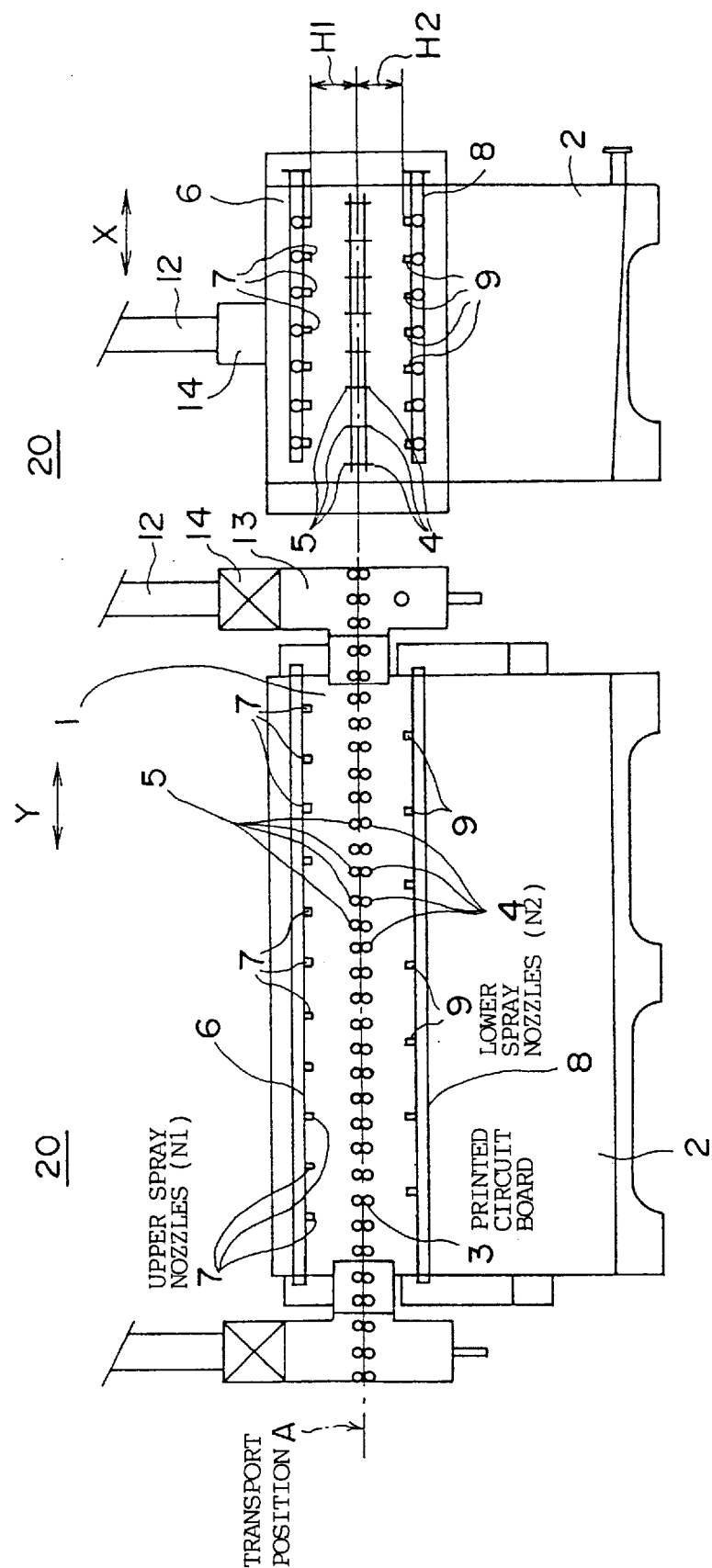

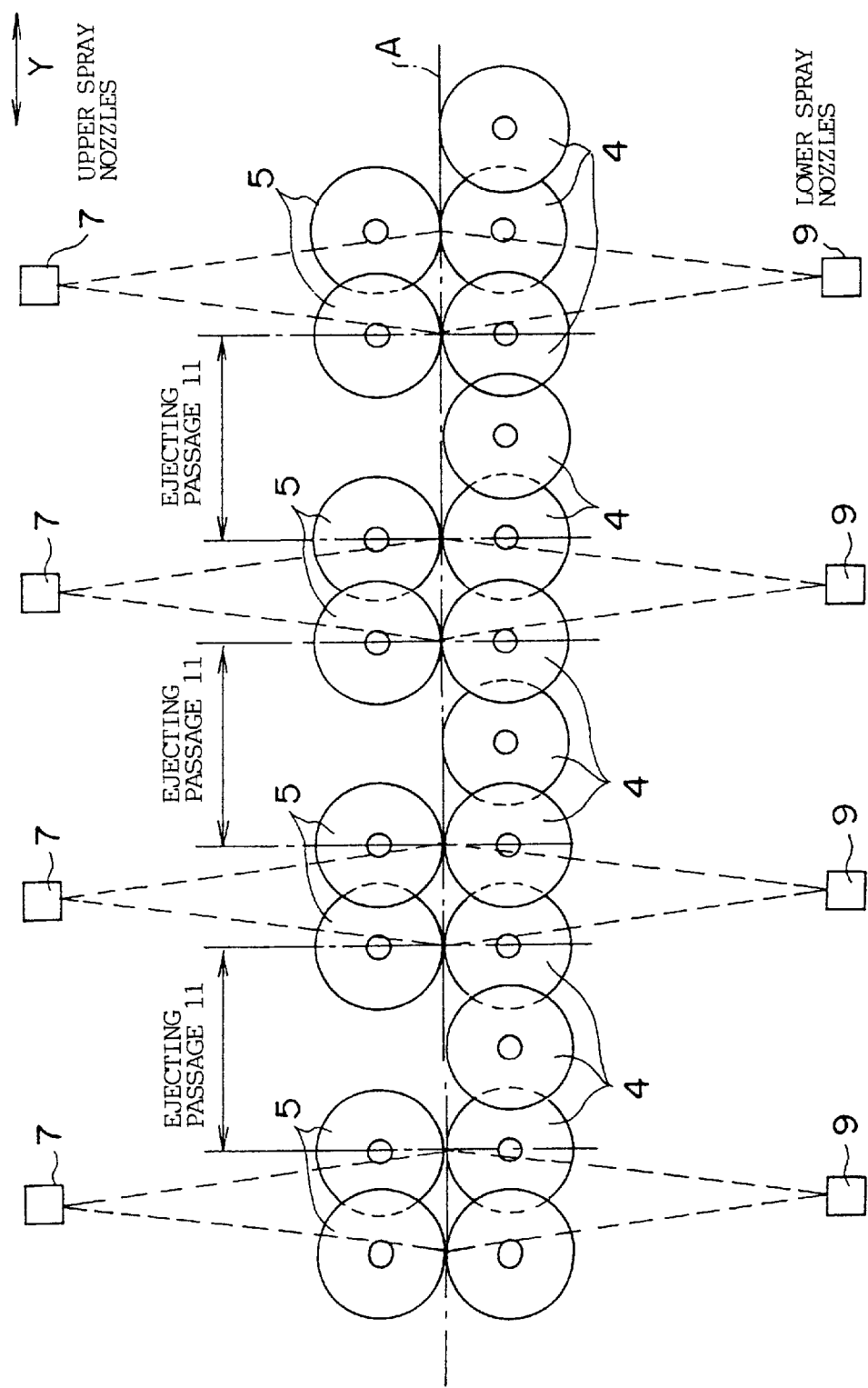

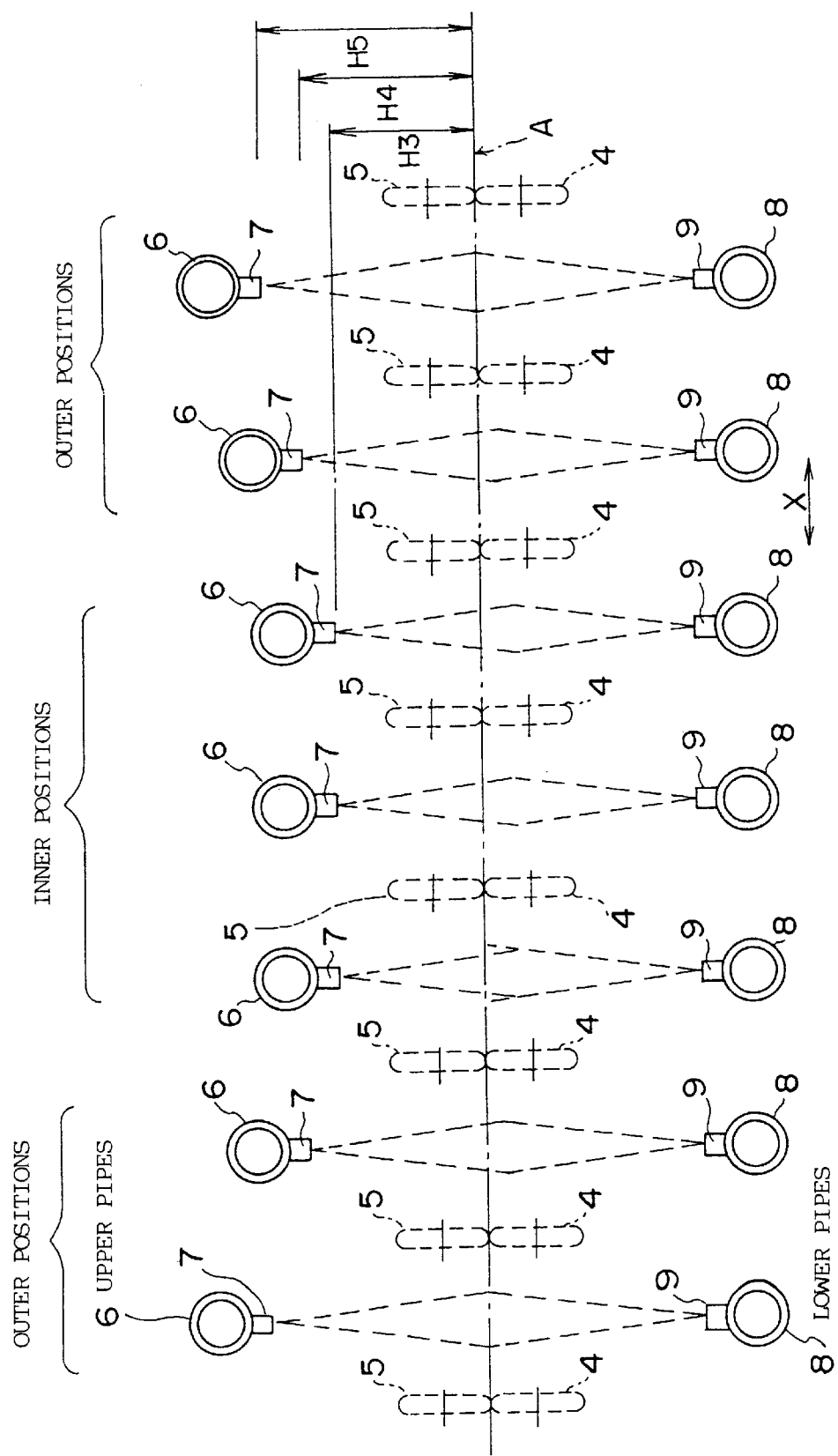

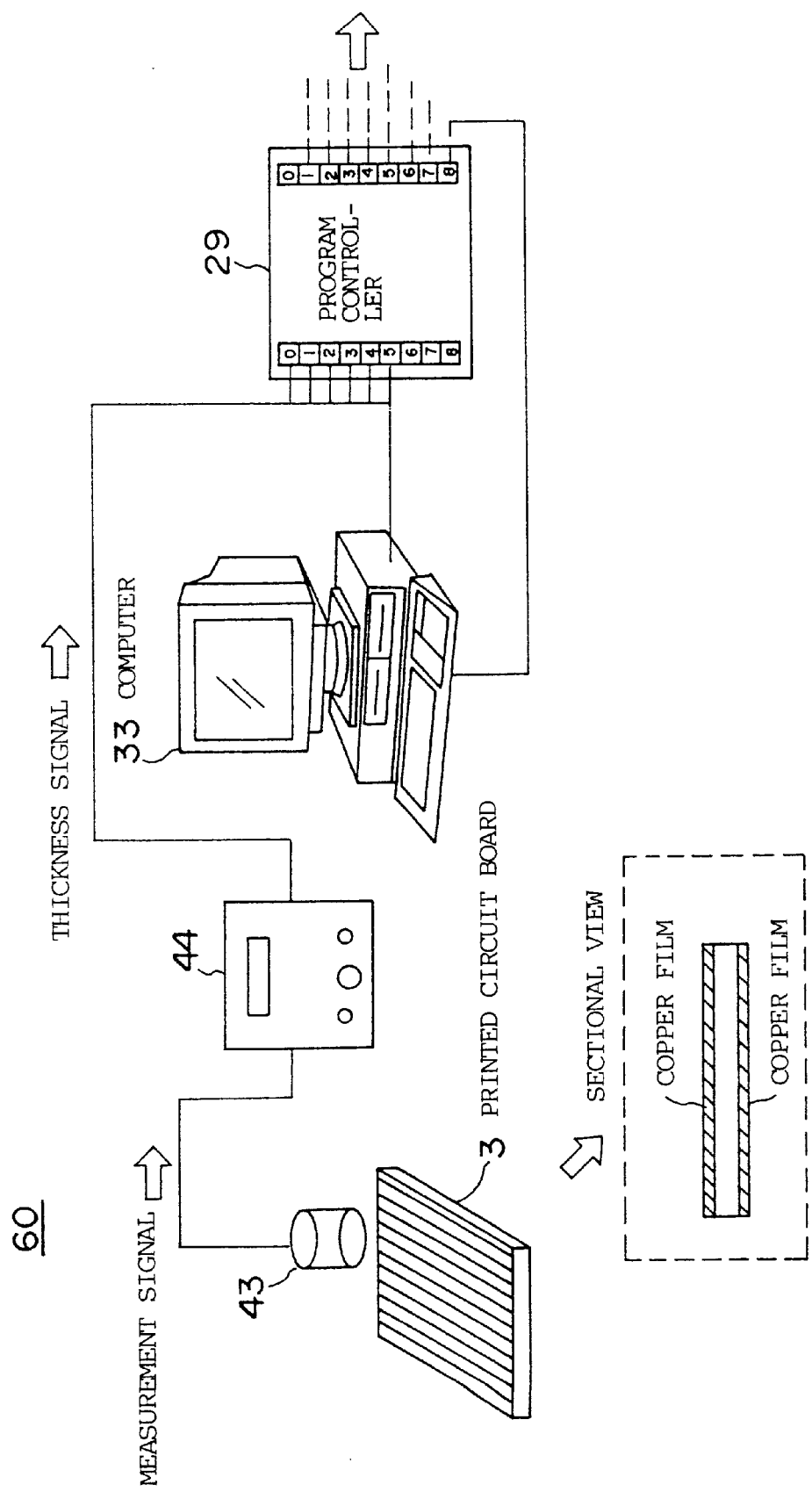

APPARATUS AND METHOD FOR ETCHING PRINTED CIRCUIT BOARD

This application is a division of prior application Ser. No. 08/754,941, filed Nov. 25, 1996, abandoned, which is a continuation of application Ser. No. 08/288,925, filed Aug. 11, 1994, abandoned.

BACKGROUND OF THE INVENTION (1) Field of the Invention

The present invention generally relates to an apparatus and method for etching a printed circuit board, and more particularly to an etching apparatus and method for etching a printed circuit board while the printed circuit board is horizontally transported in a transporting direction so as to keep a height of the printed circuit board at a transport position during etching.

(2) Description of the Prior Art

Generally, printed circuit boards are placed on various electronic devices. With development of high-performance, miniaturized electronic devices, there is the need for the printed circuit boards with high-density interconnections and with multi-layer printed patterns with thin wiring. On the other hand, digital signals, instead of analog signals, are becoming the dominant signals which are delivered through the printed circuits on the printed circuit boards. With the use of digital signals, the ratio of high-frequency circuits to the other printed circuits on the printed circuit boards are becoming greater, the high-frequency circuits processing the digital signals.

Therefore, in order to produce the multi-layer printed circuit boards with high-density interconnections, it is necessary that the manufacturing process steps are carried out with accurate widths of the interconnecting wires and with accurate distances between the adjacent wires on the printed circuit boards.

Generally, in order to produce a pattern of a film such as copper deposited over a board which forms a printed circuit on the board, it is necessary to carry out an etching process in which selected areas of the film deposited over the entire surface, as defined by a photoresist, are locally etched away to leave only the metal for interconnections. Thus, to realize high accuracy of the multi-layer printed circuit boards with high-density interconnections mentioned above, it is necessary to take into account the following items: 1) uniform the rate of etching a top surface of a printed circuit board and the rate of etching a bottom surface thereof; 2) uniform the rates of etching locally separate portions on the same surface of a printed circuit board; and 3) control the etching quantity in accordance with the thickness of a metal film deposited over the entire surface.

Horizontal-transport type etching machines are frequently used because the etching machines of this type can perform the etching of a printed circuit board with relatively accurate dimensions of the pattern of the film etched away. In the horizontal-transport type etching machine, a printed circuit board is horizontally transported so that a height of the printed circuit board during etching is kept at a transport position. The etching machine mentioned above includes an upper spray pipe above the transport position on which upper spray nozzles are arranged to inject an etchant into a top surface of the printed circuit board, and a lower spray pipe below the transport position on which lower spray nozzles are arranged to inject an etchant into a bottom surface of the printed circuit board.

The upper spray pipe and the lower spray pipe are connected to a spray pump, and the etchant under pressure is supplied by the spray pump to these spray pipes, so that the etchant is injected by the upper spray nozzles and the lower spray nozzles to the printed circuit board. Thus, selected areas of a metal film deposited over the entire surface of the printed circuit board, as defined by a photoresist, are locally etched away.

A conventional etching machine which is the horizontal-transport type described above comprises the upper spray pipe and the lower spray pipe, wherein the number of the upper spray nozzles on the upper spray pipe and the number of the lower spray nozzles on the lower spray pipe are the same, and the pressures of the etchant injected by each upper spray nozzle and of the etchant injected by each lower spray nozzle are the same. Further, in the conventional etching machine, a height of each of the upper spray nozzles above the transport position is substantially equal to a height of each of the lower spray nozzles below the transport position. In addition, the conventional etching machine comprises a single etching tank and a plurality of spray pipes within the etching tank, and all the pressures of the etchant injected by the individual spray nozzles are the same, and the pressures of the etchant injected cannot be controlled independently.

The conventional etching machine in which the spray nozzles are thus arranged has a problem in that although the etchant injected by each lower spray nozzle to the bottom surface of the printed circuit board will fall to the bottom of the etching tank, the etchant injected by each upper spray nozzle to the top surface of the printed circuit board will not immediately fall to the bottom of the etching tank but remains on the top surface.

As a certain amount of the etchant remains on the top surface of the printed circuit board, the remaining etchant will become an obstacle to etch the printed circuit board with a new etchant subsequently injected by the upper spray nozzles. The metal film at corresponding portions of the printed circuit board is not effectively etched away, and the etching ability will deteriorate and the etching speed will decrease. Thus, the efficiency of the etching will be lowered and it is difficult to perform the etching of the printed circuit board with accurate dimensions of the pattern of the film etched away.

A conceivable method to resolve the above problem is to increase the pressure of the etchant injected by each upper spray nozzle to a high pressure level enough to remove the remaining etchant on the top surface of the printed circuit board, allowing the top surface to be effectively etched with a new etchant subsequently injected by the upper spray nozzles. However, the increased pressure level of the etchant injected cannot exceed the strength of the photoresist. Thus, when the above method is applied, it is difficult to increase the pressure of the etchant injected by each upper spray nozzle to a sufficiently high pressure level at which the remaining etchant can be completely removed.

Another method to resolve the above problem is to decrease the pressure of the etchant injected by each lower spray nozzle relative to the pressure of the etchant injected by each upper spray nozzle, so as to uniform the rate of etching the top surface of a printed circuit board and the rate of etching the bottom surface. However, when this method is applied, the limitation of the decreased pressure level exists, and the etching speed of the entire etching machine will decrease and the efficiency of the etching will deteriorate.

When the etching of an inside layer of a multi-layer printed circuit board is performed by using a conventional etching machine in which the height of each of the upper spray nozzles above the transport position is substantially equal to the height of each of the lower spray nozzles below the transport position, the etching speed relating to the inner or middle areas on the top of the inside layer becomes lower than the etching speed relating to the outer or peripheral areas on the top of the inside layer. For this reason, lines of the pattern of the film in the inner areas on the top of the inside layer become thicker and lines of the pattern of the film in the outer areas on the top of the inside layer become thinner after the etching is performed, even if the thicknesses of photoresists in the inner areas and in the outer areas are the same.

Therefore, it is difficult for the conventional etching machine to realize the etching of the multi-layer printed circuit board with accurate dimensions of the film pattern which dimensions are in accordance with the line width of a desired circuit.

On the other hand, when the etching of an outside layer of a multi-layer printed circuit board is performed by using the conventional etching machine mentioned above, the lines of the film pattern in the outer areas on the outside layer become thicker and the lines of the film pattern in the inner areas thereon become thinner since the film on the outside layer is plated. For this reason, the etching speed relating to the inner areas on the outside layer is likely to be higher than the etching speed relating to the outer areas thereon. Even if the thicknesses of photoresists in the inner areas and in the outer areas are the same, the widths of the lines in the outer areas will become too great and the widths of the lines in the inner areas will become too small.

Therefore, it is difficult for the conventional etching machine to realize the etching of the multi-layer printed circuit board with accurate dimensions of the pattern of the film which dimensions are in accordance with the line width of a desired circuit.

Further, the conventional etching machine comprises a single etching tank and a plurality of spray pipes within the etching tank, as described above. All the pressures of the etchant injected by the individual spray nozzles are the same, and the pressures of the etchant injected cannot be controlled independently. Therefore, there are only two methods for controlling the etching quantity in accordance with the thickness of a metal film deposited over the entire surface with the conventional etching machine, that is: one is to control the pressure of the etchant injected by each spray nozzle; and the other is to control the transporting speed of a printed circuit board by the transport mechanism.

The conventional etching machine usually has a single etching tank, and the range of pressures of the etching injected by each spray nozzle which can be suitably controlled by the conventional etching machine is limited and narrow. For this reason, in order to change considerably the etching quantity, it is necessary to change considerably the transporting speed of the printed circuit board by the transport mechanism. However, when the changing of the transporting speed is applied, a change in the etching quantity responsive to a significantly small change in the transporting speed becomes excessively great. Thus, it is very difficult to control the etching quantity in accordance with the thickness of a metal film deposited over the entire surface by changing the pressure of the etchant injected to the printed circuit board or changing the transporting speed of the printed circuit board.

SUMMARY OF THE INVENTION

Accordingly, it is a general object of the present invention to provide an improved etching apparatus and method in which the above described problems are eliminated.

Another object of the present invention is to provide an etching apparatus and method which can efficiently carry out the etching of a printed circuit board, allowing high accuracy of the dimensions of the pattern of the metal film on the printed circuit board after it is etched.

Still another object of the present invention is to provide an etching apparatus and method which can efficiently carry out the etching of a multi-layer printed circuit board, allowing high accuracy of the dimensions of the pattern of the metal on the printed circuit board after it is etched.

A further object of the present invention is to provide an etching apparatus and method which can control the etching quantity suitable for various thicknesses of metal films deposited over various printed circuit boards.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper spray nozzles for injecting an etchant to a top surface of the printed circuit board transported by the transport mechanism; and a plurality of lower spray nozzles for injecting an etchant to a bottom surface of the printed circuit board, wherein the upper spray nozzles and the lower spray nozzles are arranged so that a first height of the upper spray nozzles above the transport position is smaller than a second height of the lower spray nozzles below the transport position, so as to make a flow rate of the etchant injected to the top surface of the printed circuit board greater than a flow rate of the etchant injected to the bottom surface of the printed circuit board.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper spray nozzles for injecting an etchant to a top surface of the printed circuit board transported by the transport mechanism; and a plurality of lower spray nozzles for injecting an etchant to a bottom surface of the printed circuit board, wherein the number of the upper spray nozzles is greater than the number of the lower spray nozzles, so as to make a flow rate of the etchant injected to the top surface of the printed circuit board greater than a flow rate of the etchant injected to the bottom surface of the printed circuit board.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper spray nozzles for injecting an etchant to a top surface of the printed circuit board transported by the transport mechanism; a plurality of lower spray nozzles for injecting an etchant to a bottom surface of the printed circuit board; and a plurality of ejecting passages for allowing the etchant injected from the upper spray nozzles to the top surface of the printed circuit board to be ejected in transverse directions perpendicular to the transporting direction of the printed circuit board transported by the transport mechanism.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper spray nozzles for injecting an etchant to a top surface of the printed circuit board transported by the transport mechanism; and a plurality of lower spray nozzles for injecting an etchant to a bottom surface of the printed circuit board, wherein the upper spray nozzles are transversely arranged with respect to the transporting direction, and comprise inner spray nozzles at inner positions along transverse lines perpendicular to the transporting direction, and outer spray nozzles at outer positions along the transverse lines, and wherein the upper spray nozzles are arranged so that first heights of the inner spray nozzles above the transport position are smaller than second heights of the outer spray nozzles above the transport position.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper pipes each having a plurality of upper spray nozzles for injecting an etchant to a top surface of the printed circuit board transported by the transport mechanism, the upper pipes being transversely arranged with respect to the transporting direction; and a plurality of lower pipes each having a plurality of lower spray nozzles for injecting an etchant to a bottom surface of the printed circuit board, the lower pipes being transversely arranged with respect to the transporting direction so that the upper pipes and the lower pipes are opposed to each other, wherein the upper pipes comprise inner pipes at inner positions along transverse lines perpendicular to the transporting direction, and outer pipes at outer positions along the transverse lines, and wherein the upper pipes are arranged so that the number of the upper spray nozzles included in each of the inner pipes is greater than the number of the upper spray nozzles included in each of the outer pipes.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper pipes each having a plurality of upper spray nozzles for injecting an etchant to a top surface of the printed circuit board transported by the transport mechanism, the upper pipes being transversely arranged with respect to the transporting direction; and a plurality of lower pipes each having a plurality of lower spray nozzles for injecting an etchant to a bottom surface of the printed circuit board, the lower pipes being transversely arranged with respect to the transporting direction so that the upper pipes and the lower pipes are opposed to each other, wherein the upper pipes comprise inner pipes at inner positions along transverse lines perpendicular to the transporting direction, and outer pipes at outer positions along the transverse lines, and wherein the upper pipes are arranged so that first heights of the upper spray nozzles included in each of the inner pipes above the transport position are greater than second heights of the upper spray nozzles included in each of the outer pipes above the transport position.

The above mentioned object of the present invention is achieved by an etching apparatus which includes: a transport mechanism for horizontally transporting a printed circuit board in a transporting direction so that a height of the printed circuit board during etching is kept at a transport position; a plurality of upper pipes each having a plurality of upper spray nozzles for injecting an etchant to a top surface of the printed circuit board transported by the transport mechanism, the upper pipes being transversely arranged with respect to the transporting direction; and a plurality of lower pipes each having a plurality of lower spray nozzles for injecting an etchant to a bottom surface of the printed circuit board, the lower pipes being transversely arranged with respect to the transporting direction so that the upper pipes and the lower pipes are opposed to each other, wherein the upper pipes comprise inner pipes at inner positions along transverse lines perpendicular to the transporting direction, and outer pipes at outer positions along the transverse lines, and wherein the upper pipes are arranged so that the number of the upper spray nozzles included in each of the outer pipes is greater than the number of the upper spray nozzles included in each of the inner pipes.

The above mentioned object of the present invention is achieved by an etching apparatus which includes: a transport mechanism for horizontally transporting a printed circuit board in a transporting direction so that a height of the printed circuit board during etching is kept at a transport position; a plurality of spray pipes each having a plurality of spray nozzles for injecting an etchant to the printed circuit board transported by the transport mechanism, the spray pipes being transversely arranged with respect to the transporting direction; and an etchant supplying mechanism for supplying the etchant to the plurality of spray pipes so that the etchant is injected from the spray nozzles in each of the spray pipes to the printed circuit board, wherein the spray pipes comprise outer pipes at outer positions along transverse lines perpendicular to the transporting direction and inner pipes at inner positions along the transverse lines, wherein the etchant supplying mechanism comprises a set of first connecting pipes through which the etchant is supplied to the outer pipes and a set of second connecting pipes through which the etchant is supplied to the inner pipes, and wherein the etching apparatus further comprises a set of first control valves arranged in the first connecting pipes for adjusting a first flow rate of the etchant supplied to each of the outer pipes, and a set of second control valves arranged in the second connecting pipes for adjusting a second flow rate of the etchant supplied to each of the inner pipes, and the first flow rate and the second flow rate being adjusted by the first control valves and the second control valves independently of each other.

The above mentioned object of the present invention is achieved by an etching apparatus which includes: a transport mechanism for horizontally transporting a printed circuit board in a transporting direction so that a height of the printed circuit board during etching is kept at a transport position; a plurality of spray pipes each having a plurality of spray nozzles for injecting an etchant to the printed circuit board transported by the transport mechanism, the spray pipes being transversely arranged with respect to the transporting direction; and an etchant supplying mechanism for supplying the etchant to the plurality of spray pipes so that the etchant is injected from the spray nozzles in each of the spray pipes to the printed circuit board, wherein the spray pipes comprise outer pipes at outer positions along transverse lines perpendicular to the transporting direction and inner pipes at inner positions along the transverse lines, wherein the etchant supplying mechanism comprises a set of first connecting pipes through which the etchant is supplied to the outer pipes and a set of second connecting pipes through which the etchant is supplied to the inner pipes, and wherein the etchant supplying mechanism further comprises a set of first pumps connected to the first connecting pipes for supplying the etchant to each of the outer pipes at first flow rates, and a set of second pumps connected to the second connecting pipes for adjusting the etchant to each of the inner pipes at second flow rates, and the first flow rates relating to the outer pipes and the second flow rates relating to the inner pipes being adjusted independently of each other by setting the first pumps and the second pumps.

The above mentioned object of the present invention is achieved by an etching apparatus which includes: a transport mechanism for horizontally transporting a printed circuit board in a transporting direction so that a height of the printed circuit board during etching is kept at a transport position; an etching tank within which the printed circuit board is etched with an etchant, the etching tank being divided into a set of compartments, the compartments being longitudinally arranged with respect to the transporting direction and separated by a set of separating walls; a plurality of sets of spray pipes, each set provided within each of the compartments, each of the spray pipes having a plurality of spray nozzles for injecting the etchant to the printed circuit board transported by the transport mechanism, the spray pipes of each set being transversely arranged with respect to the transporting direction; and an etchant supplying mechanism for supplying the etchant to each set of the spray pipes provided within each of the compartments so that the etchant is injected from the spray nozzles in each of the spray pipes to the printed circuit board, wherein the etchant supplying mechanism comprises a set of connecting pipes through which the etchant is supplied to each set of the spray pipes, and a set of control pumps respectively connected to the connecting pipes for supplying the etchant to the respective sets of the spray pipes at first flow rates, and the first flow rates of the etchant supplied to the respective sets of the spray pipes for each of the compartments being selectively controlled by setting the control pumps.

According to the present invention, it is possible to make the flow rate of the etchant injected to the top surface of the printed circuit board greater than the flow rate of the etchant injected to the bottom surface thereof even if a certain amount of the etchant remains on the top surface of the printed circuit board during etching. Therefore, it is possible to make the rate of etching the top surface of the printed circuit board equal to the rate of etching the bottom surface thereof, allowing high accuracy of the pattern of the film deposited over the printed circuit board after it is etched.

According to the present invention, it is possible to make the flow rate of the etchant injected to the inner positions of the printed circuit board greater than the flow rate of the etchant injected to the outer positions thereof even if the etching of an inside layer of a multi-layer printed circuit board is performed. Therefore, it is possible to make the rate of etching the inner positions equal to the rate of etching the outer positions, allowing high accuracy of the pattern of the film deposited over the printed circuit board after it is etched.

According to the present invention, it is possible to make the flow rate of the etchant injected to the outer positions of the printed circuit board greater than the flow rate of the etchant injected to the inner positions thereof even if the etching of an outside layer of a multi-layer printed circuit board is performed. Therefore, it is possible to make the rate of etching the outer positions equal to the rate of etching the inner positions, allowing high accuracy of the pattern of the film deposited over the printed circuit board after it is etched.

According to the present invention, it is possible to control the etching quantity suitable for various thicknesses of metal films deposited over various printed circuit boards without changing considerably the transporting speed by the transport mechanism.

BRIEF DESCRIPTION OF THE DRAWINGS

The above and other objects, features and advantages of the present invention will be more apparent from the following detailed description when read in conjunction with the accompanying drawings in which:

FIGS. 1A and 1B are diagrams showing an etching apparatus in a first embodiment of the present invention;

FIGS. 2A and 2B are diagrams showing an etching apparatus in a second embodiment of the present invention;

FIG. 3 is a diagram showing a transport mechanism of an etching apparatus in a third embodiment of the present invention;

FIG. 4 is a diagram showing an etching apparatus in a fourth embodiment of the present invention;

FIG. 20 is a system diagram showing an etching apparatus in a fourteenth embodiment of the present invention.

DESCRIPTION OF THE PREFERRED EMBODIMENTS

Figure 5:
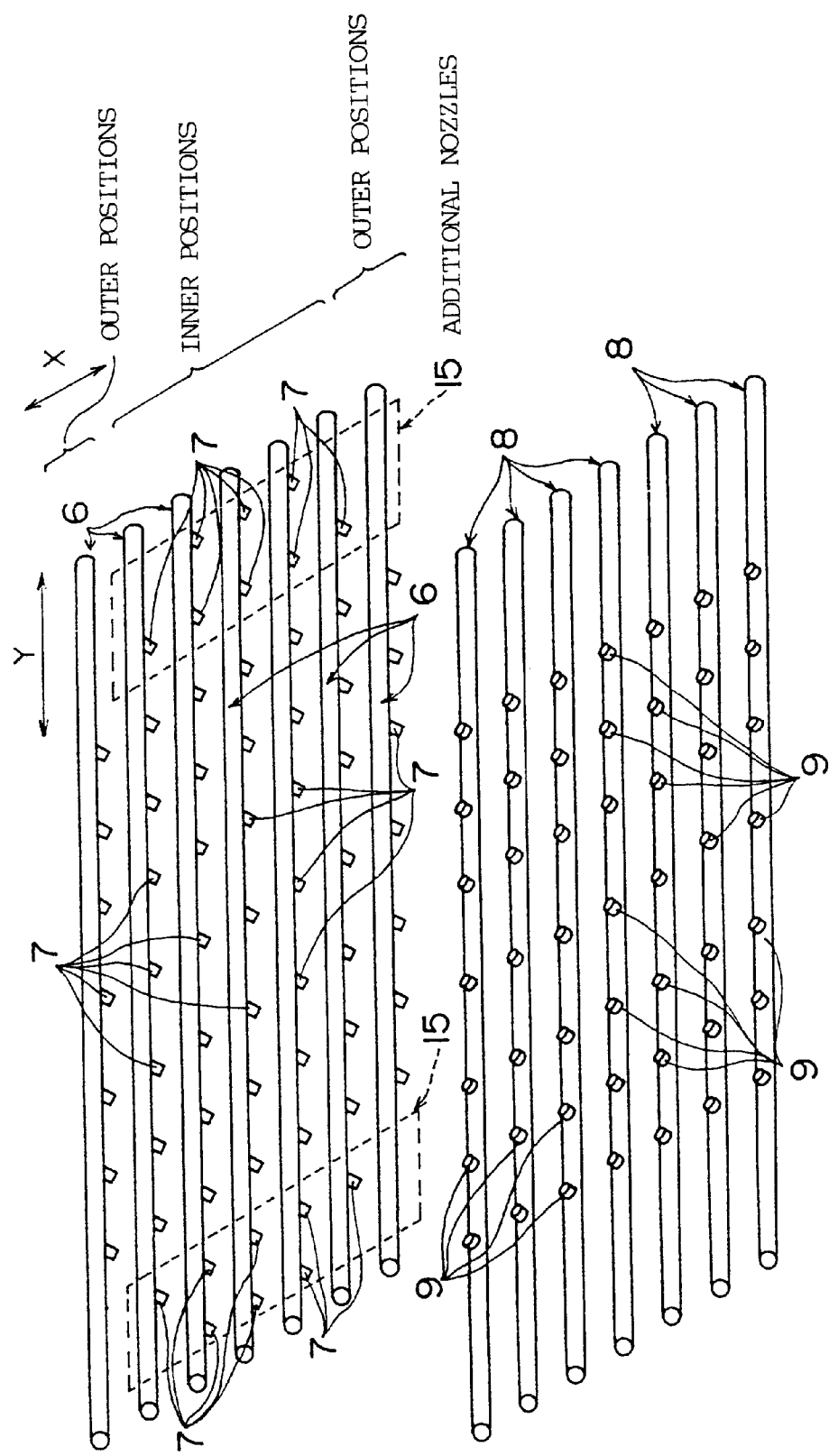
FIG. 5 is a diagram showing upper spray pipes and lower spray pipes of an etching apparatus in a fifth embodiment of the present invention.

A description will now be given of an etching apparatus in a first embodiment of the present invention with reference to FIGS. 1A and 1B.

In FIGS. 1A and 1B, an etching apparatus 10 includes an etching tank 1 at an upper portion, and a reservoir 2 at a lower portion. The reservoir 2 serves to store a remaining etchant after the etching within the etching tank 1 is performed. The etching apparatus 10 includes a transport mechanism which horizontally transports a printed circuit board 3 in a transporting direction at a given rate so that a height of the printed circuit board 3 during etching is kept at a transport position.

The transport position is indicated by a one-dot chain line "A" in FIGS. 1A and 1B, and the transporting direction is indicated by an arrow "Y" in FIG. 1A. Hereinafter, the transporting direction is referred to as a longitudinal line of the etching apparatus, and a transverse direction perpendicular to the transporting direction is referred to as a transverse line of the etching apparatus. The transverse direction is indicated by an arrow "X" in FIG. 1B.

The transport mechanism includes a plurality of rows of transport rollers 4 on the transport position A and a plurality of rows of pressure rollers 5 on the transport position A, which are opposed to each other. The transport rollers 4 in each row and the pressure rollers in each row are longitudinally arranged in the transporting direction. The transport rollers 4 are rotated by a drive motor (not shown) so that the printed circuit board 3 is transported at the given rate in a forward transporting direction (or, the right direction in FIG. 1A). The pressure rollers 5 opposed to the transport rollers 4 serve to exert downward pressure onto the printed circuit board 3 against the transport rollers 4 during the transporting of the printed circuit board 3.

The etching apparatus 10 further includes a plurality of upper spray pipes 6 above the transport position A and a plurality of lower spray pipes 8 below the transport position A, which are both extending in directions parallel to the transporting direction Y. As shown in FIG. 1B, the upper spray pipes 6 and the lower spray pipes 8 are transversely arranged and opposed to each other. The upper spray pipes 6 each have a plurality of upper spray nozzles 7 which are longitudinally arranged at fixed intervals along the upper spray pipe in the transporting direction Y. The lower spray pipes 8 each have a plurality of lower spray nozzles 9 which are longitudinally arranged at the fixed intervals along the lower spray pipe in the transporting direction Y. In this embodiment, the upper spray nozzles 7 above the transport position A and the lower spray nozzles 9 below the transport position A are opposed to each other.

The upper spray pipes 6 and the lower spray pipes 8 are connected to a spray pump (not shown), and a pressure is given by the spray pump to an etchant within the etching tank 1. The etchant under the pressure is supplied by the spray pump to the upper spray pipes 6 and to the lower spray pipes 8, so that the etchant is injected from the upper spray nozzles 7 to a top surface of the printed circuit board 3, and the etchant is, at the same time, injected from the lower spray nozzles 9 to a bottom surface of the printed circuit board 3 while the printed circuit board 3 is horizontally transported by the transport mechanism at a given transporting rate.

The etching apparatus 1 includes an exhaust duct 12, a cleaning spray 13, and a mist separator 14. The gas within the etching tank 1 is ejected from the exhaust duct 12 through the cleaning spray 13 and the mist separator 14.

On the printed circuit board 3 which is conveyed from a preceding process step into the etching apparatus 10, a metal film such as copper is deposited over the entire surface, and selected areas of the metal film are defined by a photoresist. Thus, as the etchant injected from the upper and lower spray nozzles 7 and 9 is supplied to the printed circuit board 3, unselected areas of the film on the printed circuit board are locally etched away to leave only the metal needed for interconnections so that a pattern for a desired circuit can be produced on the printed circuit board 3.

As shown in FIGS. 1A and 1B, in the first embodiment, the upper spray nozzles 7 are arranged at a relatively near position above the transport position A, at which the printed circuit board 3 is horizontally transported, and the lower spray nozzles 9 are arranged at a relatively farther position below the transport position A. That is, the upper spray nozzles 7 and the lower spray nozzles 9 are arranged so that a first height H1 of the upper spray nozzles 7 above the transport position A is smaller that a second height H2 of the lower spray nozzles 9 below the transport position A (H1<H2), so as to make a flow rate of the etchant injected to the top surface of the printed circuit board greater than a flow rate of the etchant injected to the bottom surface of the printed circuit board.

Therefore, since the pressures of the etchant injected by each upper spray nozzle 7 and of the etchant injected by each lower spray nozzle 9 are the same, the first embodiment described above makes it possible to make the flow rate of the etchant injected to the top surface of the printed circuit board 3 greater than the flow rate of the etchant injected to the bottom surface without changing considerably the transporting speed of the transport mechanism or the pressures of the etchant injected by the upper and lower spray nozzles. Hence, even if a certain amount of the etchant remains on the top surface of the printed circuit board 3 during etching, it is possible to make the rate of etching the top surface of the printed circuit board 3 equal to the rate of etching the bottom surface thereof. Accordingly, it is possible to realize the forming of selected patterns of metal films with accurate and uniform dimensions on the top and bottom surfaces of the printed circuit board after it is etched.

Next, a description will be given of a second embodiment of the present invention, with reference to FIGS. 2A and 2B. FIGS. 2A and 2B show an etching apparatus 20 in the second embodiment. In FIGS. 2A and 2B, the parts which are the same as corresponding parts shown in FIGS. 1A and 1B are designated by the same reference numerals, and a description thereof will be omitted.

In FIGS. 2A and 2B, the etching apparatus 20 includes the upper spray pipes 6 above the transport position A and the lower spray pipes 8 below the transport position A which are similar to those shown in FIGS. 1A and 1B. Each of the upper spray pipes 6 has a plurality of the longitudinally arranged upper spray nozzles 7, and each of the lower spray pipes 8 has a plurality of the longitudinally arranged lower spray nozzles 9. However, in the second embodiment, the number N1 of the upper spray nozzles 7 in each upper spray pipe is greater than the number N2 of the lower spray nozzles 9 in each lower spray pipe (N1>N2), and the first height H1 of the upper spray nozzles 7 above the transport position A is the same as the second height H2 of the lower spray nozzles 9 below the transport position A (H1=H2).

Therefore, in the second embodiment described above, it is possible to make the flow rate of the etchant injected to the top surface of the printed circuit board 3 greater than the flow rate of the etchant injected to the bottom surface without changing considerably the transporting speed by the transport mechanism or the pressures of the etchant injected. In the second embodiment, the pressures of the etchant injected by each upper spray nozzle 7 and of the etchant injected by each lower spray nozzle 9 are the same, and the number of the upper spray nozzles 7 in each upper spray pipe is greater than the number of the lower spray nozzles 9 in each lower spray pipe. Hence, even if a certain amount of the etchant remains on the top surface of the printed circuit board 3 during etching, it is possible to make the rate of etching the top surface of the printed circuit board 3 equal to the rate of etching the bottom surface thereof. Accordingly, it is possible to realize the forming of selected patterns of metal films with accurate, uniform dimensions on the top and bottom surfaces of the printed circuit board with no irregularity after it is etched.

Next, a description will be given of a third embodiment, with reference to FIG. 3. FIG. 3 shows a transport mechanism of an etching apparatus in the third embodiment. In FIG. 3, the parts which are the same as corresponding parts shown in FIGS. 1A and 1B are designated by the same reference numerals, and a description thereof will be omitted.

In FIG. 3, the etching apparatus includes a plurality of ejecting passages 11 which are provided within the transport mechanism. The ejecting passages 11 serve to eject the etchant, which has already been injected from the upper spray nozzles 7 to the top surface of the printed circuit board 3 and remains on the top surface, in transverse directions X perpendicular to the transporting direction Y of the printed circuit board transported by the transport mechanism.

The transport mechanism in the third embodiment includes a plurality of longitudinally arranged transport rollers 4 which are rotated to transport the printed circuit board 3 in the transporting direction in contact with the bottom surface of the printed circuit board 3, and a plurality of longitudinally arranged pressure rollers 5 which are opposed to the transport rollers 4 and exert downward pressure onto the printed circuit board 3 against the transport rollers 4 in contact with the top surface of the printed circuit board 3. The ejecting passages 11 are arranged at portions of the transport mechanism in which only transport rollers 4 corresponding to the portions are arranged and no pressure rollers 5 opposed to those transport rollers 4 are arranged.

Since the etching apparatus in the third embodiment is provided with the ejecting passages 11, the etchant already injected from the upper spray nozzles 7 to the top surface of the printed circuit board 3 can be ejected in the transverse directions X through the ejecting passages 11 so that the etchant falls to the reservoir 2. Therefore, as the quantity of the remaining etchant is reduced in the etching apparatus in FIG. 3, it is possible to cancel the undesired influence on the etching due to the remaining etchant. Hence, the third embodiment described above can make the rate of etching the top surface of the printed circuit board 3 equal to the rate of etching the bottom surface by increasing slightly the pressure of the etchant injected by each upper spray nozzle 7.

It should be noted that it is necessary for the third embodiment to increase slightly the pressure of the etchant injected by each upper spray nozzle 7, since a small quantity of the etchant may remain on the top surface of the printed circuit board 3 during etching even with the ejecting passages 11.

In the third embodiment described above, the ejecting passages 11 can be easily provided by modifying the arrangement of the pressure rollers 5, and it is possible to make the rate of etching the top surface of the printed circuit board 3 equal to the rate of etching the bottom surface thereof by use of the ejecting passages 11. Therefore, it is possible to reduce the quantity of the remaining etchant on the printed circuit board 3 only with a simple modification of the existing etching apparatus in the manufacturing lines.

Next, a description will be given of a fourth embodiment of the present invention, with reference to FIG. 4. FIG. 4 shows an etching apparatus in the fourth embodiment. In FIG. 4, the parts which are the same as corresponding parts shown in FIGS. 1A and 1B are designated by the same reference numerals, and a description thereof will be omitted.

In FIG. 4, the etching apparatus includes a plurality of upper spray pipes 6 each of which has a plurality of upper spray nozzles 7. The upper spray pipes 6 are transversely arranged with respect to the transporting direction Y, and the upper spray nozzles 7 comprise inner spray nozzles at inner positions along transverse lines perpendicular to the transporting direction Y, and outer spray nozzles at outer positions along the transverse lines. In the fourth embodiment, the upper spray nozzles 7 are arranged so that first heights of the inner spray nozzles above the transport position A are smaller than second heights of the outer spray nozzles above the transport position A.

For example, in the etching apparatus in FIG. 4, the first heights of the inner spray nozzles above the transport position A are indicated by "H3", the second heights of the outer intermediate spray nozzles above the transport position A are indicated by "H4", and the third heights of the outermost spray nozzles above the transport position A are indicated by "H5". In this example, the upper spray nozzles 7 are arranged so that the first heights H3 are smaller than the second heights H4 and the second heights H4 are smaller than the third heights H5 (H3<H4<H5).

In the fourth embodiment, the pressure of the etchant injected to inner positions of the top surface of the printed circuit board 3 is made higher than the pressure of the etchant injected to outer positions of the top surface. Thus, the remaining etchant at the inner positions on the top surface of the printed circuit board can be removed by the etchant under the higher pressure. Accordingly, it is possible to make the rate of etching the inner positions of the top surface equal to the rate of etching the outer positions of the top surface.

The etching apparatus according to the fourth embodiment is appropriate for etching an inside layer of a multilayer printed circuit board wherein a pattern of a film including lines with uniform widths is needed.

Next, a description will be given of a fifth embodiment of the present invention with reference to FIG. 5. FIG. 5 shows upper spray pipes 6 and lower spray pipes 8 of an etching apparatus in the fifth embodiment. In FIG. 5, the parts which are the same as corresponding parts shown in FIGS. 1A and 1B are designated by the same reference numerals, and a description thereof will be omitted.

In FIG. 5, the upper spray pipes 6 are transversely arranged with respect to the transporting direction Y and the lower spray pipes 8 are also transversely arranged with respect to the transporting direction Y. The upper spray pipes 6 are provided with end portions 15 indicated by dotted lines in FIG. 5. The upper spray pipes 6 comprise inner pipes at inner positions along transverse lines perpendicular to the transporting direction Y and outer pipes at outer positions along the transverse lines. The inner pipes of the upper spray pipes 6 have additional upper spray nozzles within the end portions 15, and the outermost pipes of the upper spray pipes 6 have no additional nozzles. Thus, the upper spray pipes 6 are arranged so that the number of the upper spray nozzles included in each of the inner pipes is greater than the number of the upper spray nozzles included in each of the outer pipes.

In the fifth embodiment, the pressure of the etchant injected to inner positions of the top surface of the printed circuit board 3 is made higher than the pressure of the etchant injected to outer positions of the top surface. Thus, even if the etchant remains at the inner positions on the top surface of the printed circuit board, the remaining etchant can be removed by the etchant under the higher pressure. Accordingly, it is possible to make the rate of etching the inner positions of the top surface equal to the rate of etching the outer positions of the top surface.

The etching apparatus according to the fifth embodiment is appropriate for etching an inside layer of a multi-layer printed circuit board wherein a pattern of a film including lines with uniform widths is needed.

Figure 6:
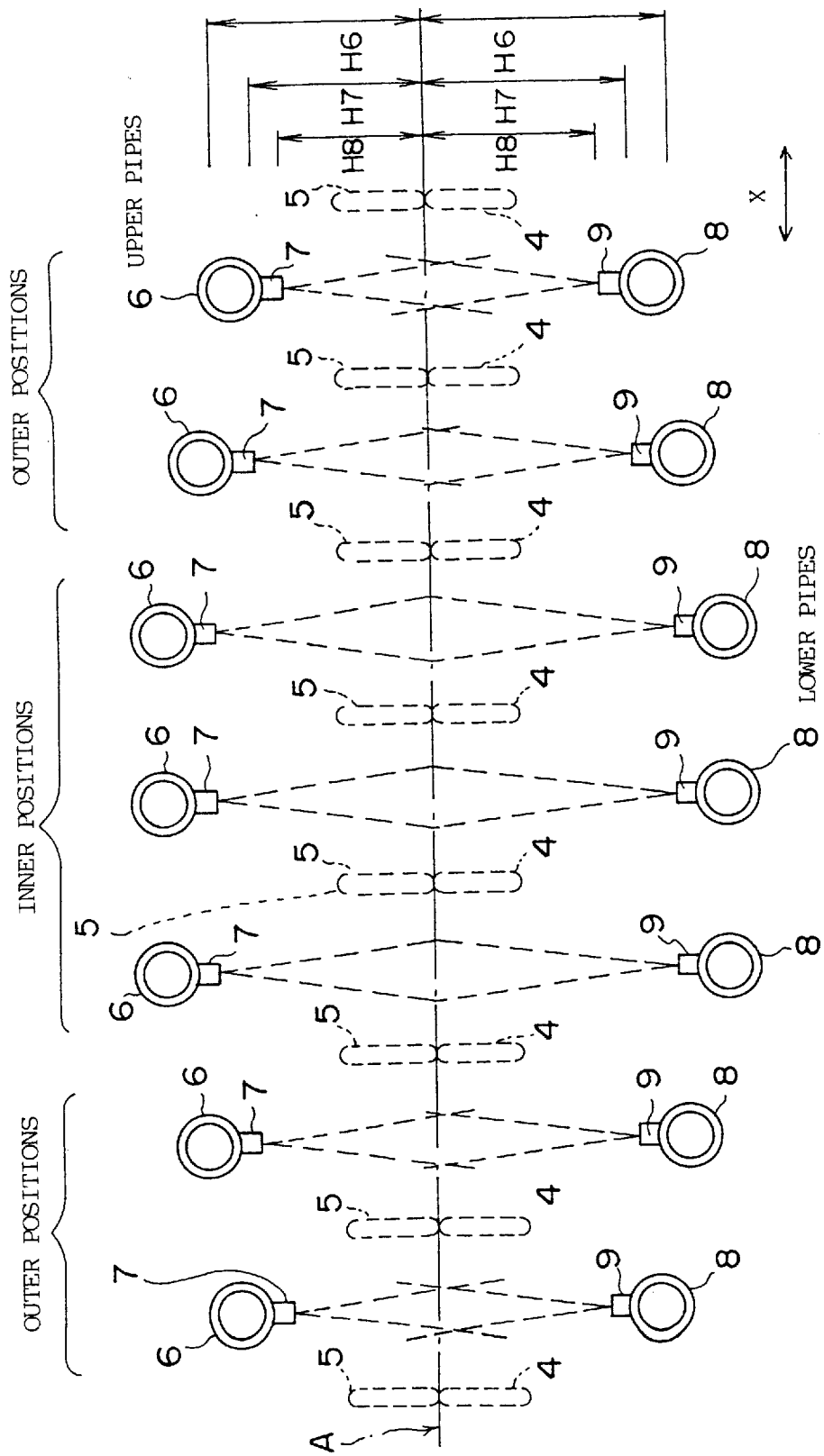
FIG. 6 is a diagram showing an etching apparatus in a sixth embodiment of the present invention.

FIG. 6 shows an etching apparatus in a sixth embodiment of the present invention. In FIG. 6, the parts which are the same as corresponding parts shown in FIGS. 1A and 1B are designated by the same reference numerals, and a description thereof will be omitted.

In FIG. 6, the etching apparatus includes a plurality of upper spray pipes 6 each of which has a plurality of upper spray nozzles 7, and a plurality of lower spray pipes 8 each of which has a plurality of lower spray nozzles 9. The upper spray pipes 6 are transversely arranged with respect to the transporting direction Y, and the upper spray nozzles 7 comprise inner spray nozzles at inner positions along transverse lines perpendicular to the transporting direction Y, and outer spray nozzles at outer positions along the transverse lines. Similarly, the lower spray pipes 8 are transversely arranged with respect to the transporting direction Y, and the lower spray nozzles 9 comprise inner spray nozzles at inner positions along transverse lines perpendicular to the transporting direction Y, and outer spray nozzles at outer positions along the transverse lines.

In the sixth embodiment, the upper spray pipes 6 are arranged so that first heights of the inner spray nozzles of the upper spray nozzles 7 above the transport position A are greater than second heights of the outer spray nozzles of the upper spray nozzles 7 above the transport position A, and the lower spray pipes 8 are arranged so that third heights of the inner spray nozzles of the lower spray nozzles 9 below the transport position A are greater than fourth heights of the outer spray nozzles of the lower spray nozzles 9 below the transport position A.

For example, in FIG. 6, the first heights of the inner spray nozzles above the transport position A are indicated by "H6", the second heights of the outer intermediate spray nozzles above the transport position A are indicated by "H7", and the third heights of the outermost spray nozzles above the transport position A are indicated by "H8". In this example, the upper spray nozzles 7 are arranged so that the first heights H6 are greater than the second heights H7 and the second heights H7 are greater than the third heights H8 (H6>H7>H8). Similarly, the fourth heights of the inner spray nozzles of the lower spray nozzles 9 below the transport position A are indicated by "H6" (the same as the first heights), the fifth heights of the outer intermediate spray nozzles below the transport position A are indicated by "H7" (the same as the second heights), and the sixth heights of the outermost spray nozzles below the transport position A are indicated by "H8" (the same as the third heights). In this example, the lower spray nozzles 9 are arranged so that the fourth heights H6 are greater than the fifth heights H7 and the fifth heights H7 are greater than the sixth heights H8 (H6>H7>H8).

In the sixth embodiment, the pressure of the etchant injected to outer positions of the top surface of the printed circuit board 3 is made higher than the pressure of the etchant injected to inner positions of the top surface.

When the etching of an outside layer of a multi-layer printed circuit board is performed, the lines of the film pattern in the outer areas on the outside layer become thicker and the lines of the film pattern in the inner areas thereon become thinner since the film on the outside layer is plated. Therefore, when the outside layer of the multi-layer printed circuit board is etched using the etching apparatus according to the sixth embodiment, it is possible to make the rate of etching the inner positions of the outside layer equal to the rate of etching the outer positions of the outside layer.

Accordingly, the etching apparatus according to the sixth embodiment is appropriate for etching an outside layer of a multi-layer printed circuit board wherein a pattern of a film having lines with uniform widths is needed.

In the sixth embodiment described above, the arrangements of the upper spray nozzles and the lower spray nozzles are taken into account. However, the present invention is not limited to this embodiment, and the concept of the sixth embodiment can be applied to the arrangement of the upper spray nozzles only.

Figure 7:
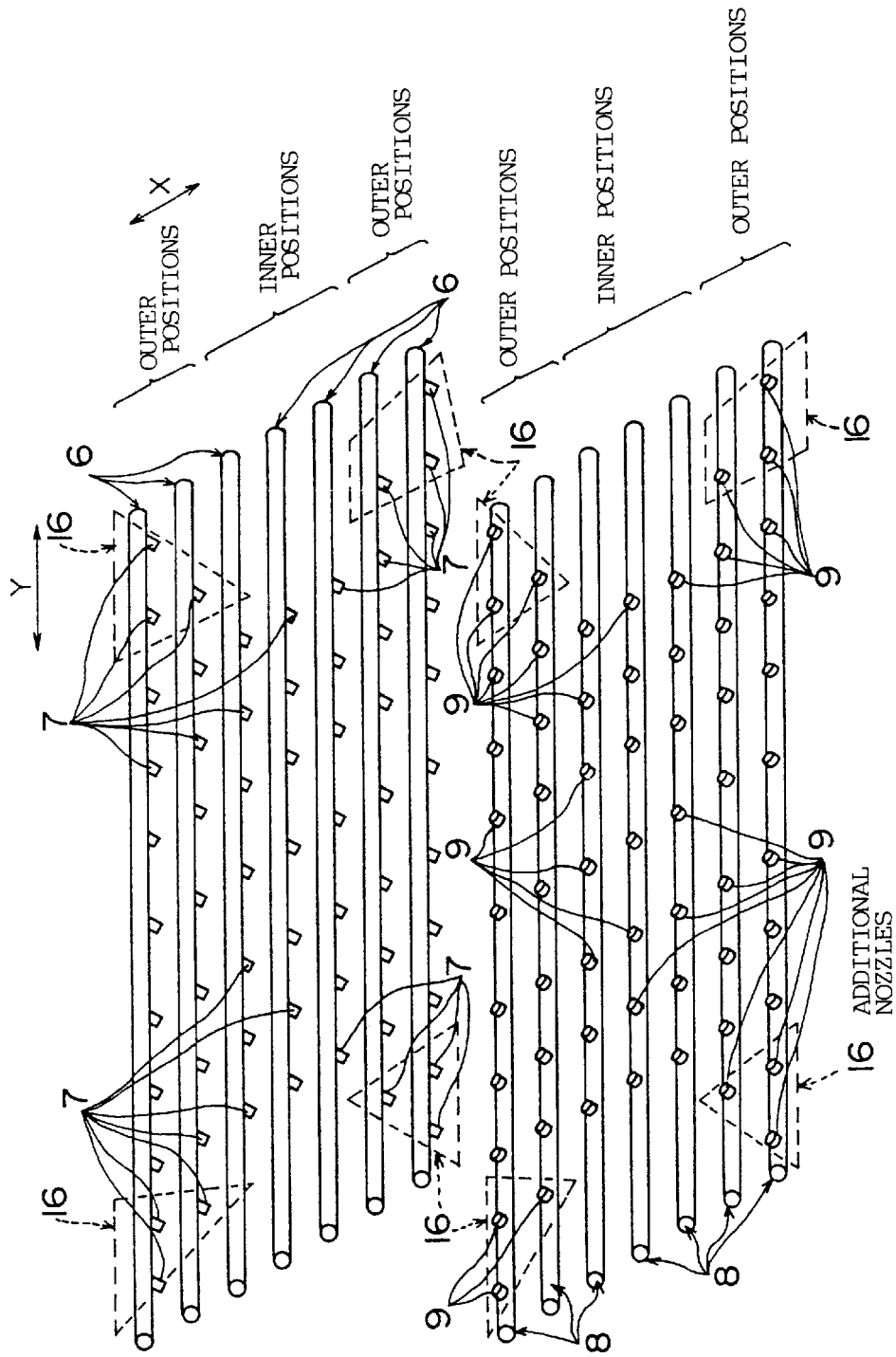
FIG. 7 is a diagram showing upper spray pipes and lower spray pipes of an etching apparatus in a seventh embodiment of the present invention.

FIG. 7 shows upper spray pipes 6 and lower spray pipes 8 of an etching apparatus in a seventh embodiment of the present invention. In FIG. 7, the parts which are the same as corresponding parts shown in FIGS. 1A and 1B are designated by the same reference numerals, and a description thereof will be omitted.

In FIG. 7, the upper spray pipes 6 are transversely arranged with respect to the transporting direction Y and the lower spray pipes 8 are also transversely arranged with respect to the transporting direction Y. The upper spray pipes 6 are provided with end portions 16 indicated by dotted lines in FIG. 7, and the lower spray pipes 8 are also provided with end portions 16 indicated by dotted lines in FIG. 7. The upper spray pipes 6 comprise inner pipes at inner positions along transverse lines perpendicular to the transporting direction Y and outer pipes at outer positions along the transverse lines. The outer pipes of the upper spray pipes 6 have additional upper spray nozzles within the end portions 16, and the inner pipes of the upper spray pipes 6 have no additional nozzles within the end portions 16. Thus, the upper spray pipes 6 are arranged so that the number of the upper spray nozzles included in each of the outer pipes is greater than the number of the upper spray nozzles included in each of the inner pipes.

Similarly to the upper spray pipes 6, the lower spray pipes 8 comprise inner pipes at inner positions along the transverse lines and outer pipes at outer positions along the transverse lines. The outer pipes of the lower spray pipes 8 have additional lower spray nozzles within the end portions 16, and the inner pipes of the lower spray pipes 8 have no additional nozzles within the end portions 16. The lower spray pipes 8 are arranged so that the number of the lower spray nozzles included in each of the outer pipes is greater than the number of the lower spray nozzles included in each of the inner pipes.

In the seventh embodiment, the pressure of the etchant injected to outer positions of the printed circuit board 3 is made higher than the pressure of the etchant injected to inner positions of the printed circuit board 3. When the etching of an outside layer of a multi-layer printed circuit board is performed, the etching apparatus in the seventh embodiment can make the rate of etching the outer positions of the outside layer equal to the rate of etching the inner positions of the outside layer.

Therefore, the etching apparatus according to the seventh embodiment is appropriate for etching an outside layer of a multi-layer printed circuit board wherein a pattern of a film including lines with uniform widths is needed.

In the seventh embodiment described above, the arrangements of both the upper spray nozzles and the lower spray nozzles are taken into account. However, the present invention is not limited to this embodiment, and the concept of the seventh embodiment is applicable to the arrangement of the upper spray nozzles only.

Figure 8:
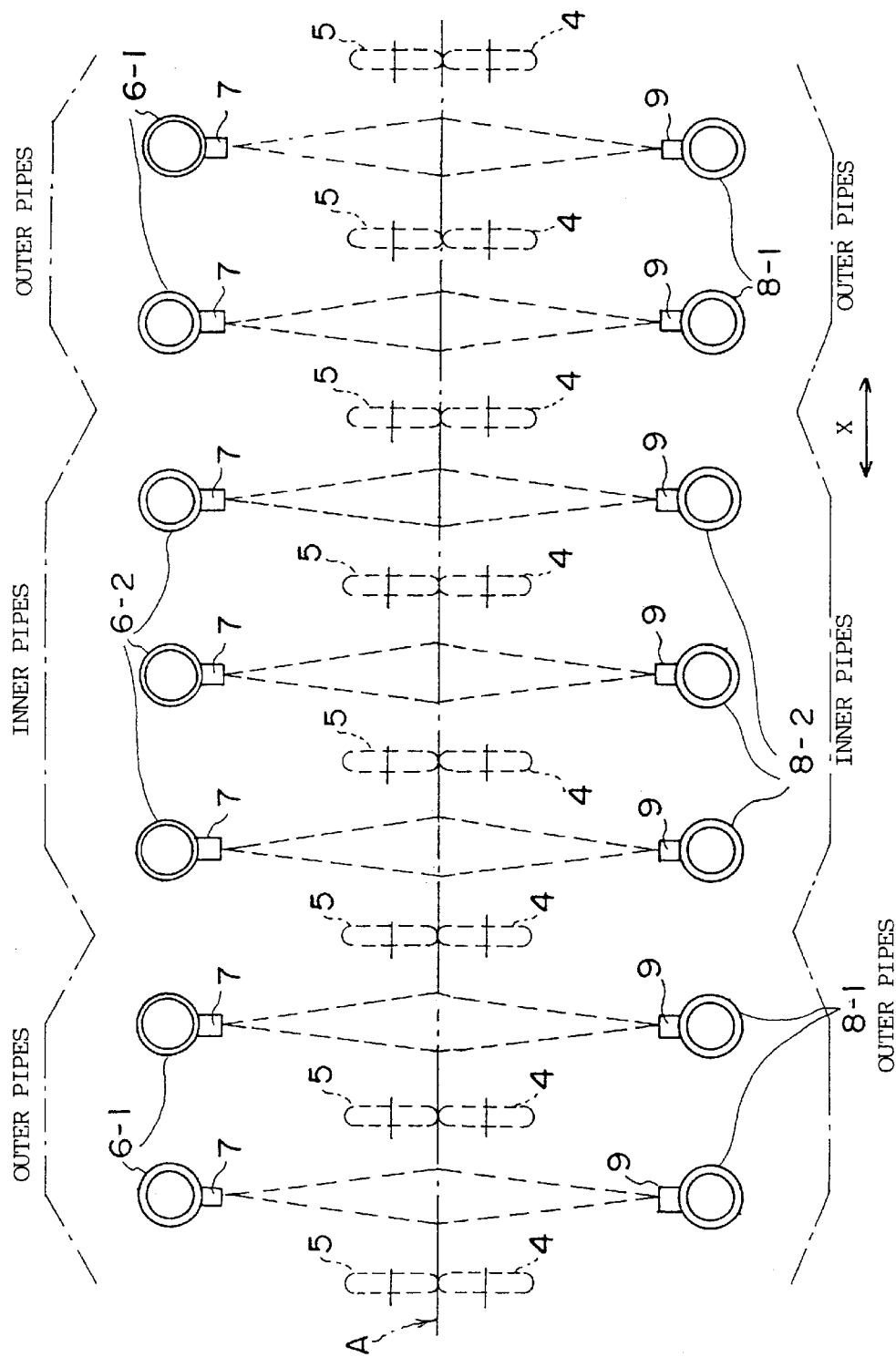
FIG. 8 is a diagram showing an etching apparatus in an eighth embodiment of the present invention.
Figure 9:
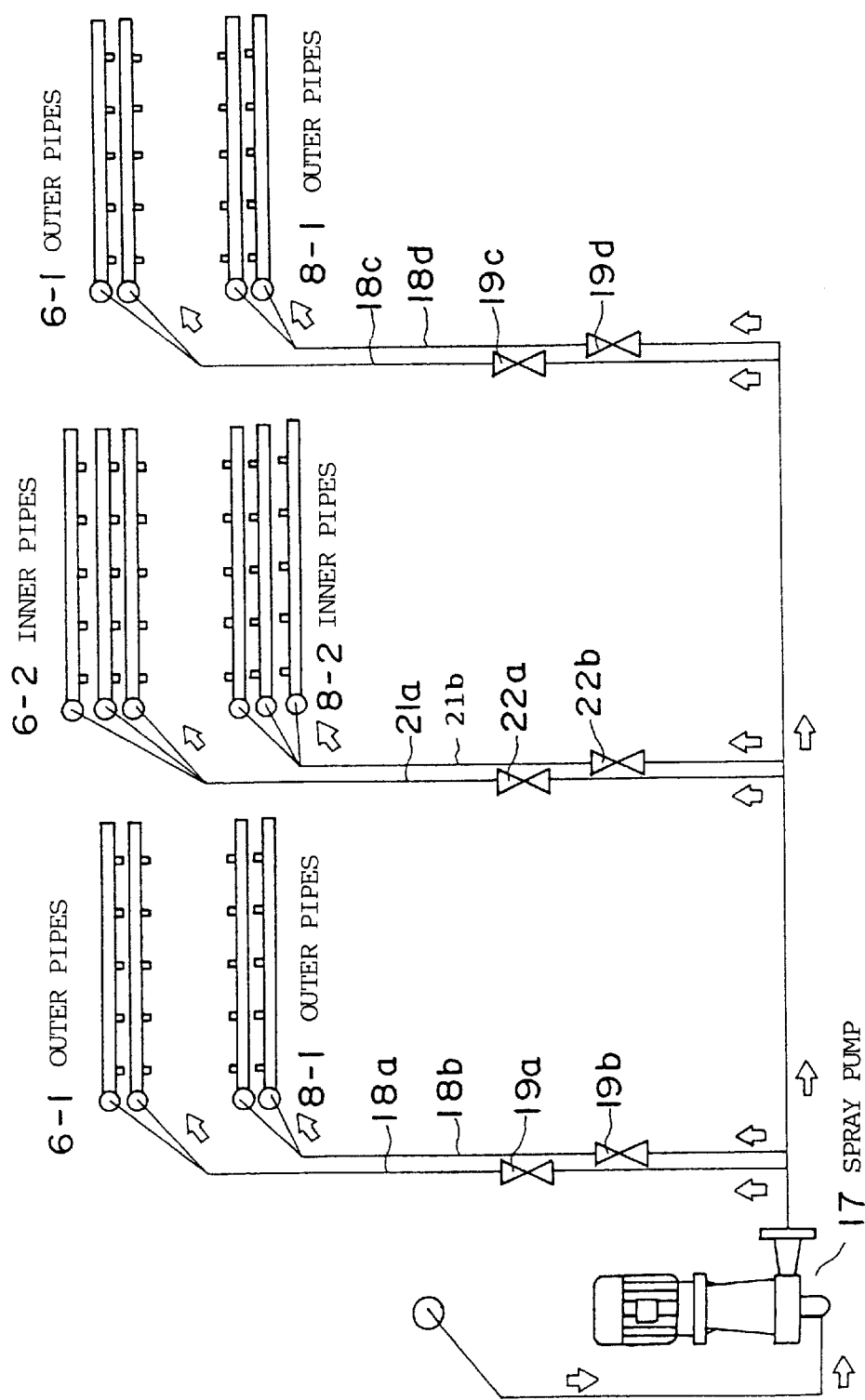
FIG. 9 is a system diagram showing the etching apparatus in FIG. 8.

FIG. 8 shows an etching apparatus in an eighth embodiment of the present invention. FIG. 9 is a system diagram showing the etching apparatus in FIG. 8. In FIGS. 8 and 9, the parts which are the same as corresponding parts shown in FIGS. 1A and 1B are designated by the same reference numerals, and a description thereof will be omitted.

In FIGS. 8 and 9, the upper spray pipes 6 comprises outer pipes 6-1 at outer positions along transverse lines X perpendicular to the transporting direction Y and inner pipes 6-2 at inner positions along the transverse lines X. The lower spray pipes 8 are respectively opposed to the upper spray pipes 6, and comprise outer pipes 8-1 at outer positions along the transverse lines X and inner pipes 8-2 at inner positions along the transverse lines X. The etching apparatus comprises a spray pump 17 for supplying the etchant to the upper and lower spray pipes 6 and 8 so that the etchant is injected from the upper and lower spray nozzles 7 and 9 to the printed circuit board 3.

The etching apparatus comprises a set of first connecting pipes 18a through 18d through which the etchant is supplied to the outer pipes 6-1 and 8-1 and a set of second connecting pipes 21a and 21b through which the etchant is supplied to the inner pipes 6-2 and 8-2. The etching apparatus further comprises a set of first control valves 19a through 19d arranged in the first connecting pipes 18a through 18d respectively for adjusting a first flow rate of the etchant supplied to each of the outer pipes 6-1 and 8-1, and a set of second control valves 22a and 22b arranged in the second connecting pipes 21a and 21b for adjusting a second flow rate of the etchant supplied to each of the inner pipes 6-2 and 8-2. The first flow rate of the etchant supplied to the outer pipes and the second flow rate of the etchant supplied to the inner pipes are adjusted by the first control valves 19a through 19d and the second control valves 22a and 22b independently of each other.

In the eighth embodiment, if the first control valves 19a through 19d and the second control valves 22a and 22b are suitably set, it is possible to control the first flow rate and the second flow rate independently of each other. Therefore, it is possible to control the pressure of the etchant injected to the outer positions of the printed circuit board and the pressure of the etchant injected to the inner positions thereof independently of each other. Accordingly, the etching apparatus in the eighth embodiment can make the rate of etching the outer positions of the printed circuit board equal to the rate of etching the inner positions of the printed circuit board.

Figure 10:
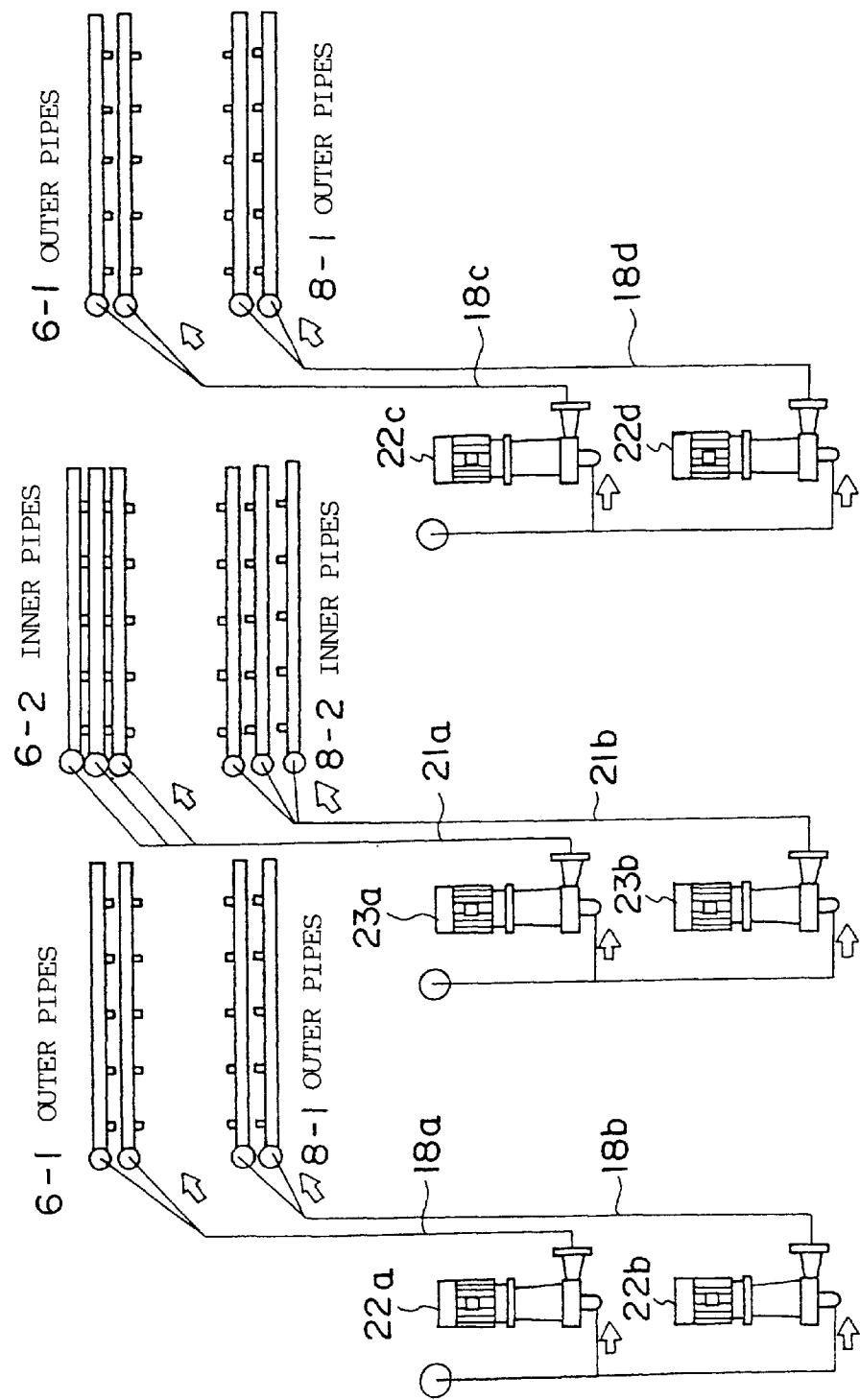
FIG. 10 is a system diagram showing an etching apparatus in a ninth embodiment of the present invention.

FIG. 10 shows an etching apparatus in a ninth embodiment of the present invention. In FIG. 10, the parts which are the same as corresponding parts shown in FIG. 9 are designated by the same reference numerals, and a description thereof will be omitted.

In FIG. 10, the etching apparatus comprises a set of first pumps 22a through 22d connected to the first connecting pipes 18a through 18d respectively for supplying the etchant to the outer pipes 6-1 and 8-1 at first flow rates, and a set of second pumps 23a and 23b connected to the second connecting pipes 21a and 21b respectively for supplying the etchant to the inner pipes 6-2 and 8-2 at second flow rates. The first flow rates relating to the outer pipes 6-1 and 8-1 and the second flow rates relating to the inner pipes 6-2 and 8-2 are adjusted independently of each other by setting the first pumps 22a–22d and the second pumps 23a and 23b.

In the ninth embodiment, if the first pumps 22a–22d and the second pumps 23a and 23b are suitably set, it is possible to control the first flow rates relating to the outer pipes 6-1 and 8-1 and the second flow rates relating to the inner pipes 6-2 and 8-2 independently of each other. Therefore, it is possible to control the pressure of the etchant injected to the outer positions of the printed circuit board and the pressure of the etchant injected to the inner positions thereof independently of each other. Accordingly, the etching apparatus in the ninth embodiment can make the rate of etching the outer positions of the printed circuit board equal to the rate of etching the inner positions of the printed circuit board.

Figure 11:
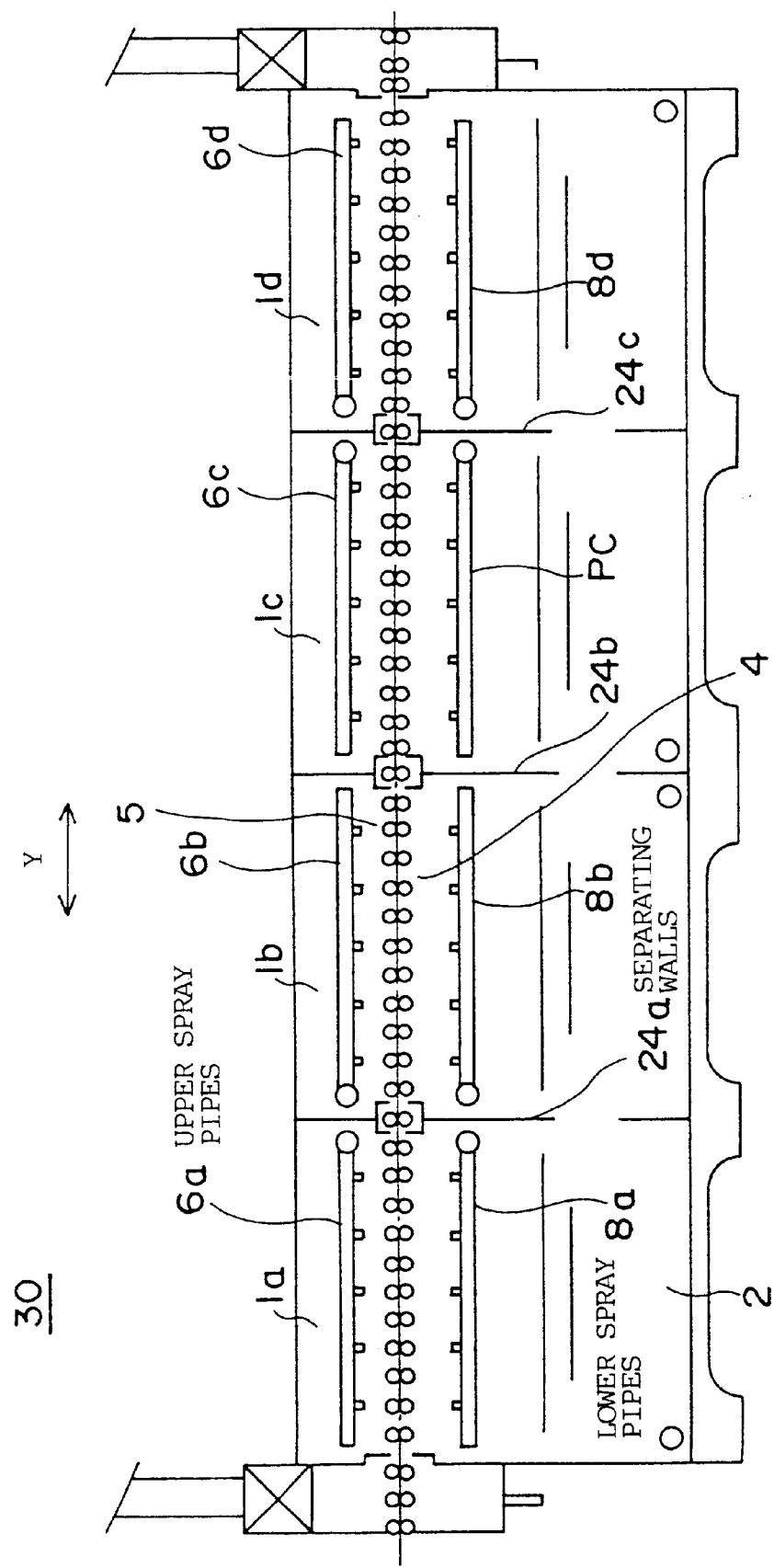
FIG. 11 is a diagram showing an etching apparatus in a tenth embodiment of the present invention.
Figure 12:
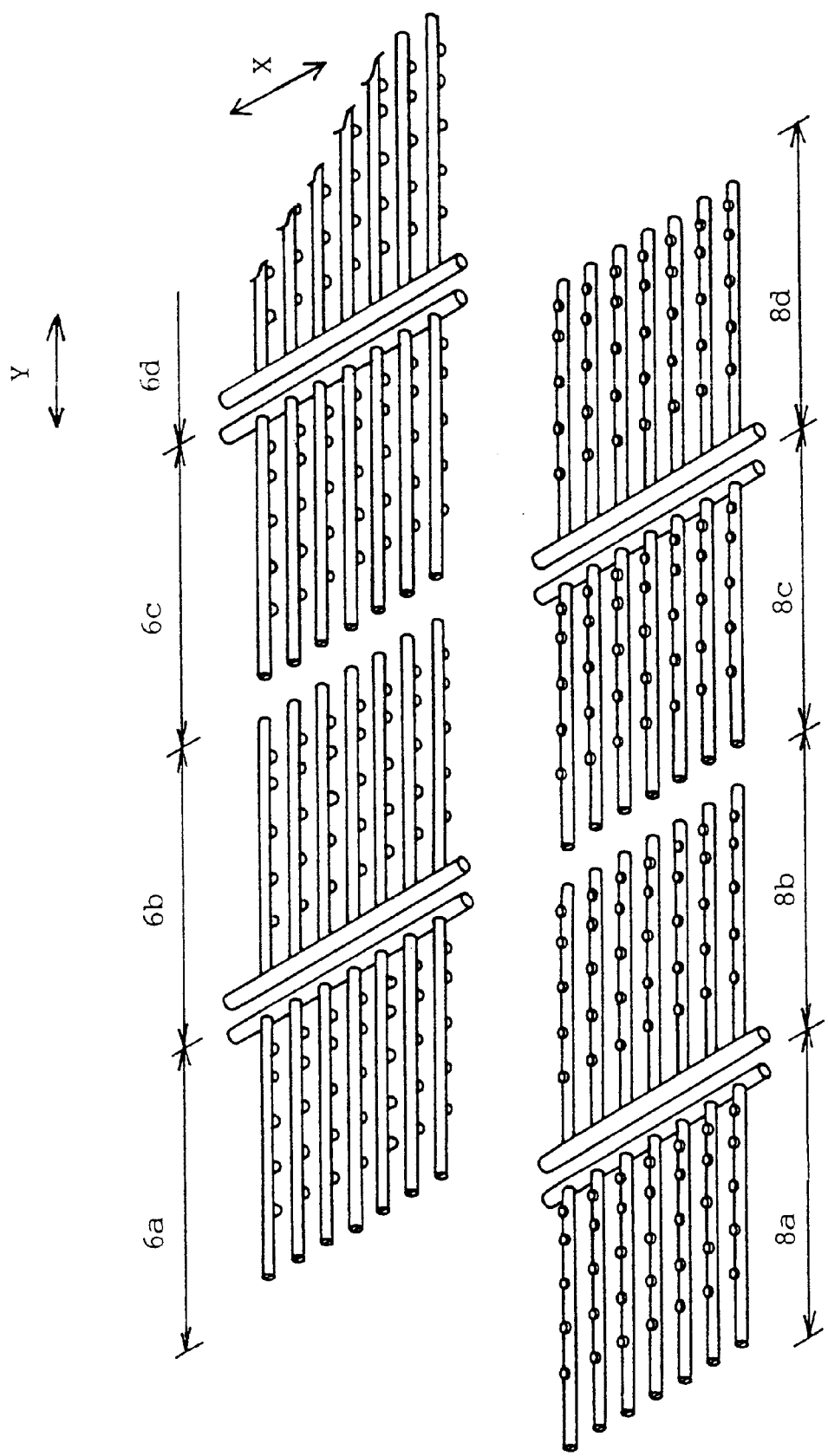
FIG. 12 is a diagram showing upper spray pipes and lower spray pipes of the etching apparatus in FIG. 11.
Figure 13:
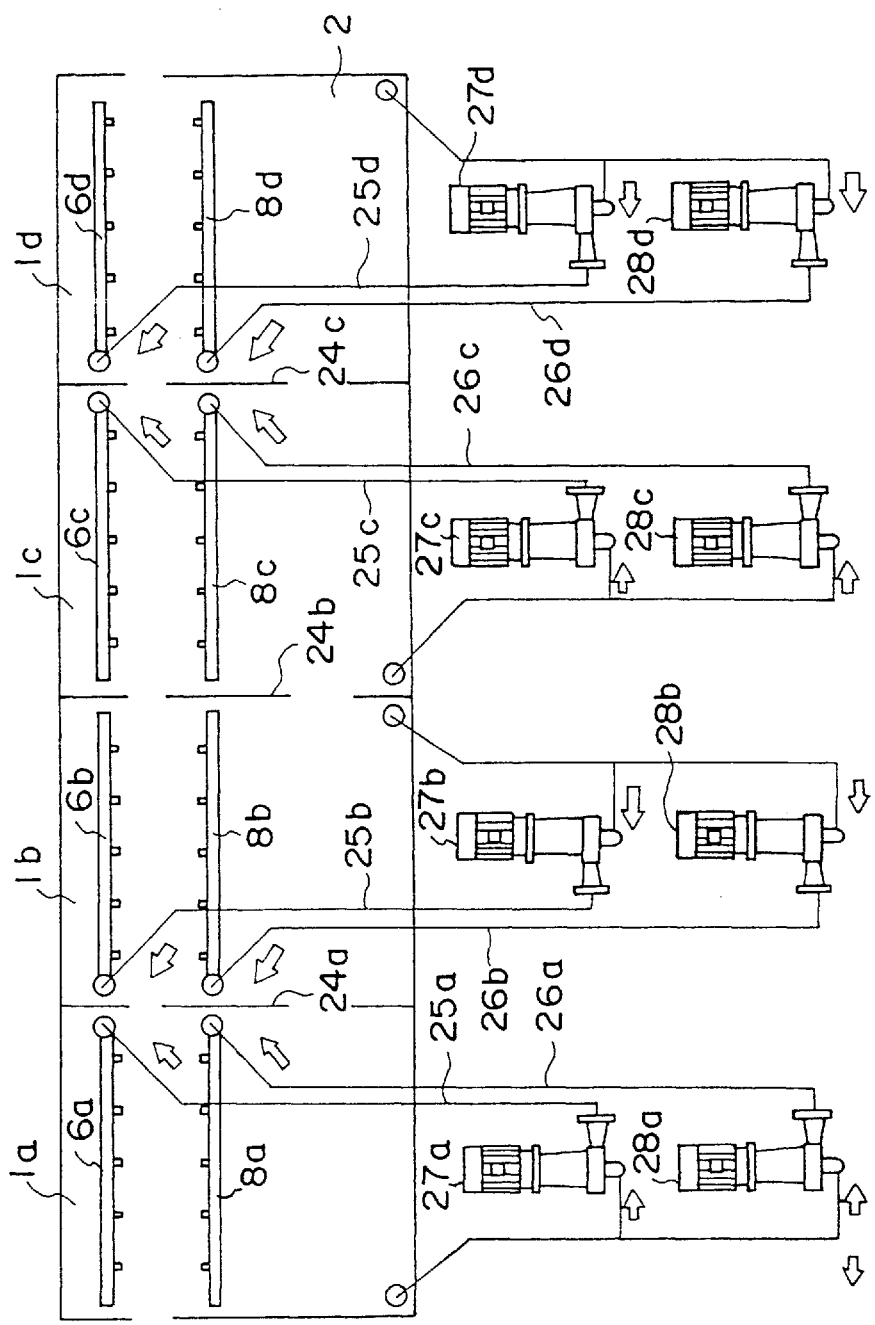
FIG. 13 is a system diagram showing the etching apparatus in FIG. 11.

Next, a description will be given of a tenth embodiment of the present invention with reference to FIGS. 11 through 13. FIG. 11 shows an etching apparatus 30 in the tenth embodiment. FIG. 12 shows upper spray pipes and lower spray pipes of the etching apparatus in FIG. 11. FIG. 13 is a system diagram showing the etching apparatus in FIG. 11. In FIGS. 11 through 13, the parts which are the same as corresponding parts shown in FIGS. 1A and 1B are designated by the same reference numerals, and a description thereof will be omitted.

In FIGS. 11 through 13, the etching apparatus 30 comprises an etching tank 1 within which a printed circuit board 3 is etched with an etchant, and the etching tank 1 is divided into a set of compartments 1a through 1d, the compartments 1a through 1d being longitudinally arranged with respect to the transporting direction Y and separated by a set of separating walls 24a through 24c. The etching apparatus 30 comprises a plurality of sets of spray pipes, that is, four sets of upper spray pipes 6a through 6d and four sets of lower spray pipes 8a through 8d. Each set of the spray pipes is provided within the individual compartments 1a through 1d, that is, the upper and lower spray pipes 6a and 8a being provided within the compartment 1a, the upper and lower spray pipes 6b and 8b provided within the compartment 1b, the upper and lower spray pipes 6c and 8c provided within the compartment 1c, and the upper and lower spray pipes 6d and 8d provided within the compartment 1d. Similarly to the etching apparatus 10, each of the spray pipes has a plurality of longitudinally arranged spray nozzles for injecting the etchant to the printed circuit board 3 transported by the transport mechanism. The spray pipes of each set are transversely arranged with respect to the transporting direction Y.

As shown in FIG. 13, the etching apparatus 30 comprises a set of first pumps 27a through 27d connected to upper connecting pipes 25a through 25d respectively for supplying the etchant to the individual upper spray pipes provided within each of the compartments 1a through 1d so that the etchant is injected from the upper spray nozzles to the printed circuit board 3. The etching apparatus 30 comprises a set of second pumps 28a through 28d connected to lower connecting pipes 26a through 26d respectively for supplying the etchant to the individual lower spray pipes provided within each of the compartments 1a through 1d so that the etchant is injected from the lower spray nozzles to the printed circuit board 3.

The first pumps 27a–27d supply the etchant to the respective sets of the upper spray pipes 6a–6d at first flow rates, respectively, and the first flow rates of the etchant supplied to the respective sets of the upper spray pipes 6a–6d for each of the compartments 1a–1d are selectively controlled by setting the first pumps 27a–27d. Similarly, the second pumps 28a–28d supply the etchant to the respective sets of the lower spray pipes 8a–8d at second flow rates, respectively, and the second flow rates of the etchant supplied to the respective sets of the lower spray pipes 8a–8d for each of the compartments 1a–1d are selectively controlled by setting the second pumps 28a–28d.

In the tenth embodiment, if the first pumps 27a–27d and the second pumps 28a–28d are suitably set, it is possible to control the first flow rates relating to the respective upper spray pipes 6a–6d for each of the four compartments and the second flow rates relating to the respective lower spray pipes 8a–8d for each of the four compartments independently of each other. Therefore, it is possible to control the pressure of the etchant injected to the outer positions of the printed circuit board and the pressure of the etchant injected to the inner positions thereof independently of each other. Accordingly, the etching apparatus in the tenth embodiment can make the rate of etching the outer positions of the printed circuit board equal to the rate of etching the inner positions of the printed circuit board.

Further, in the tenth embodiment, it is possible to control the etching quantity in accordance with the thickness of a metal film deposited over the entire surface by controlling the flow rates relating to the respective spray pipes. Therefore, when a thickness of a metal film deposited over the entire surface of a printed circuit board 3 to be etched is measured, it is possible for the tenth embodiment to control the etching quantity in accordance with the thickness measured. In the etching apparatus in the tenth embodiment, the transporting speed by the transport rollers 4 during etching is maintained at a constant speed, and it is possible to carry out the etching suitable for various thicknesses of metal films deposited over various printed circuit boards.

For example, the thicknesses of metal films such as copper deposited on the most frequently used printed circuit boards are 70 $\mu$m, 50 $\mu$m, 35 $\mu$m and 18 $\mu$m, and the ratio of the thicknesses is approximately equal to 4:3:2:1. For a printed circuit board with the thickness of 18 $\mu$m, the etchant is supplied by operating only the first pump 27a and the second pump 28a relating to the compartment 1a of the etching apparatus 30. For another printed circuit board with the thickness of 35 $\mu$m, the etchant is supplied by operating the first pumps 27a and 27b and the second pumps 28a and 28b relating to the compartments 1a and 1b. For another printed circuit board with the thickness of 50 $\mu$m, the etchant is supplied by operating the first pumps 27a–27c and the second pumps 28a–28c relating to the compartments 1a–1c. For another printed circuit board with the thickness of 70 $\mu$m, the etchant is supplied by operating all the first pumps 27a–27d and the second pumps 28a–28d relating to all the compartments 1a–1d. Therefore, the etching apparatus in the tenth embodiment can control the etching quantity suitable for various thicknesses of metal films deposited over various printed circuit boards without changing considerably the transporting speed by the transport mechanism.

Figure 14:
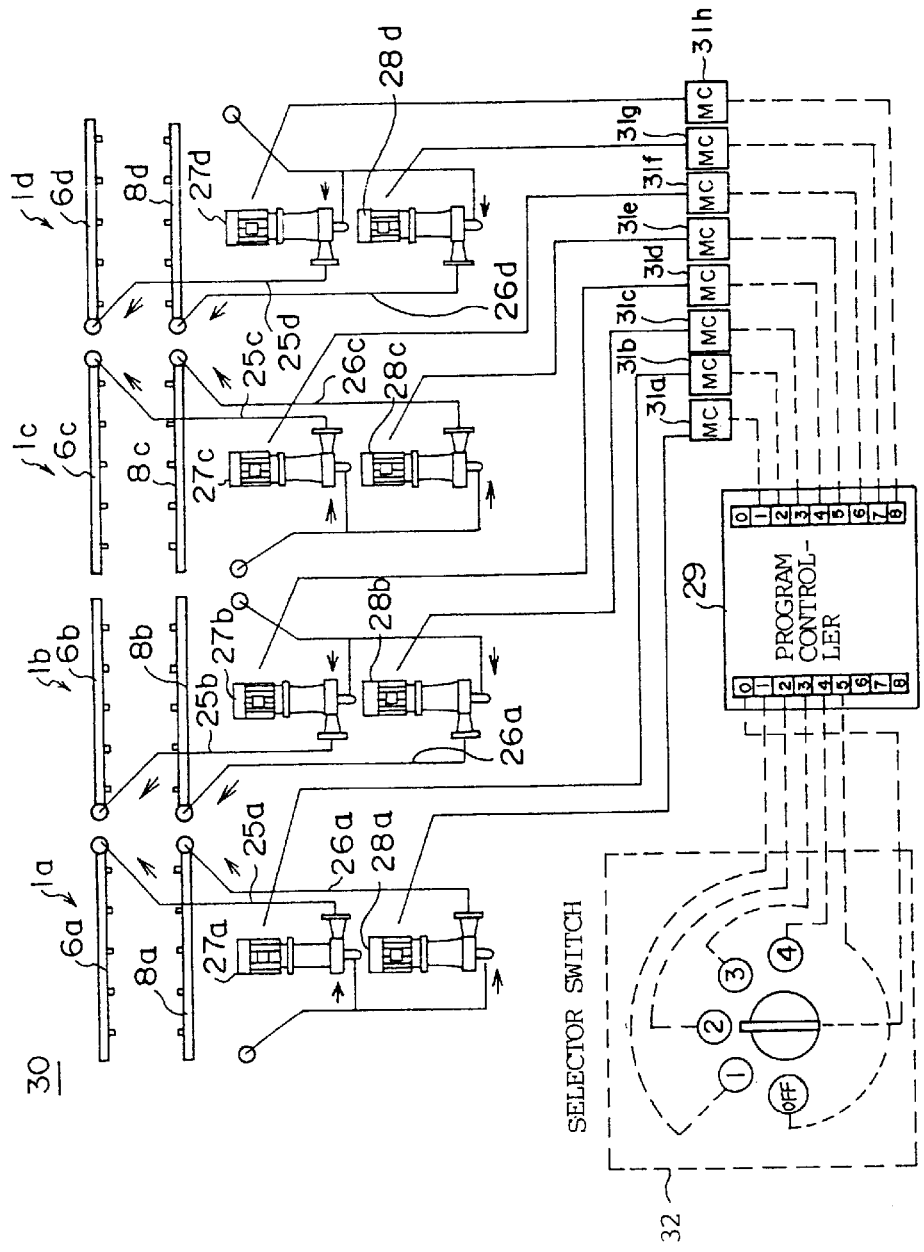
FIG. 14 is a system diagram showing an etching apparatus in an eleventh embodiment of the present invention.

FIG. 14 shows an etching apparatus 30 in an eleventh embodiment of the present invention. In FIG. 14, the parts which are the same as corresponding parts shown in FIG. 13 are designated by the same reference numerals, and a description thereof will be omitted.

In FIG. 14, the etching apparatus 30 comprises a program controller 29 for selectively setting the first pumps 27a–27d connected to the connecting pipes 25a–25d and the second pumps 28a–28d connected to the connecting pipes 26a–26d in accordance with an etching instruction signal, and a selector switch 32 for outputting an etching instruction signal to the program controller 29 in accordance with a position of the selector switch 32 set by an operator. The etching instruction signal is predetermined in accordance with the position of the selector switch 32.

The program controller 29 is connected to the first pumps 25a–25d and the second pumps 28a–28d via a set of magnet contacters (MC) 31a–31h. The program controller 29 receives the etching instruction signal from the selector switch 32, and outputs a control signal to the magnet contacters 31a–31h in accordance with the etching instruction signal. The magnet contacters 31a–31h are selectively turned on in accordance with the control signal output from the program controller 29 so that the first pumps 27a–27d and the second pumps 28a–28d are selectively set to supply the etchant to the upper spray pipes 6a–6d and the lower spray pipes 8a–8d in a controlled manner.

The selector switch 32 has four positions excluding an OFF position, as shown in FIG. 14. The four positions of the selector switch 32 correspond to, for example, the four thicknesses of metal films deposited over the most frequently used printed circuit boards which are 70 $\mu$m, 50 $\mu$m, 35 $\mu$m and 18 $\mu$m. If one of the positions of the selector switch 32 is set by the operator, the selector switch 32 outputs an etching instruction signal to the program controller 29 so that the printed circuit board 3 is automatically etched by the etching apparatus 30 in a selected mode.

Accordingly, in the eleventh embodiment described above, the first pumps 27a–27d and the second pumps 28a–28d which are respectively connected to the upper spray pipes 6a–6d and the lower spray pipes 8a–8d via the connecting pipes are controlled by the program controller 29 in accordance with the etching instruction signal, and it is possible to easily control the etching quantity suitable for various thicknesses of metal films deposited over various printed circuit boards.

Figure 15:
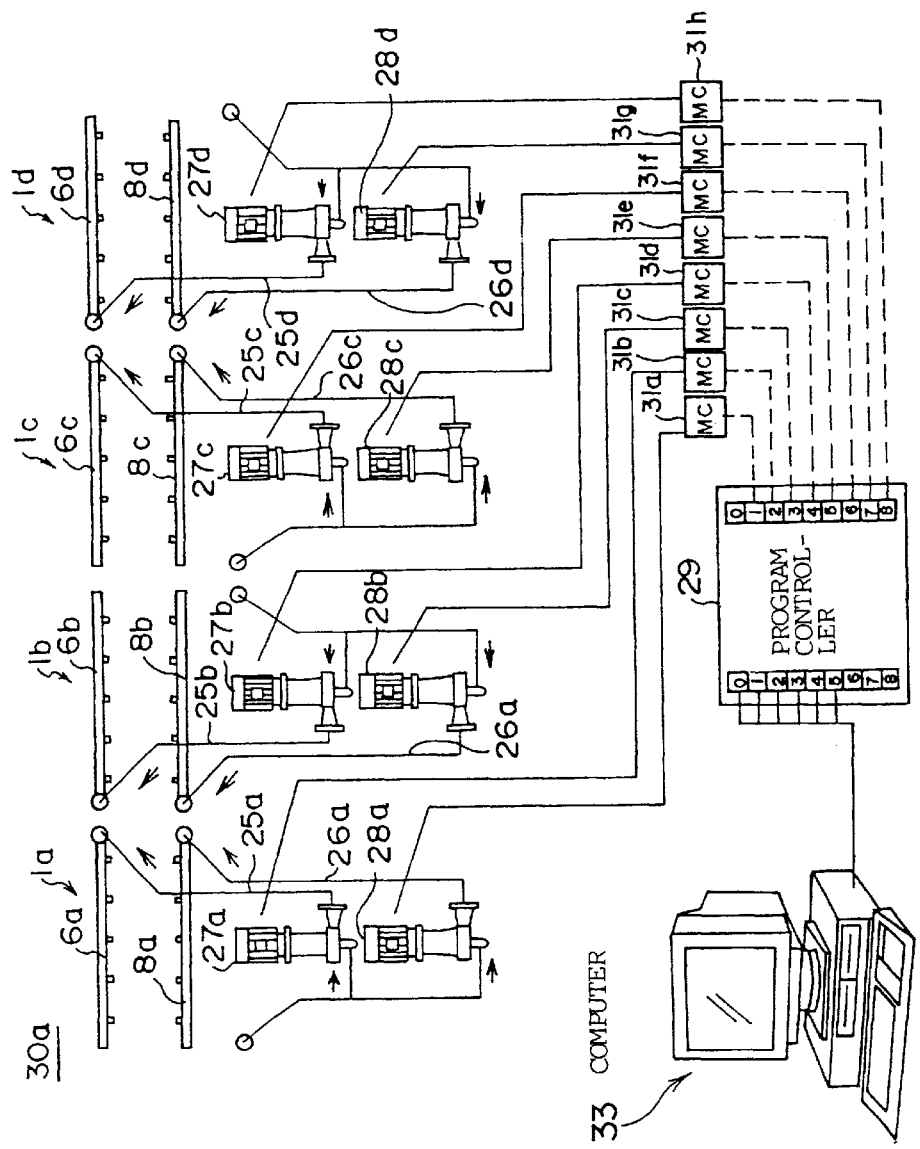
FIG. 15 is a system diagram showing a modification of the etching apparatus in FIG. 14.

FIG. 15 shows a modification of the etching apparatus in FIG. 14. In FIG. 15, the parts which are the same as corresponding parts shown in FIG. 14 are designated by the reference numerals, and a description thereof will be omitted.

In FIG. 15, an etching apparatus 30a includes a computer system 33 instead of the selector switch 32 in FIG. 14, and the computer system 33 outputs an etching instruction signal to the program controller 29. The etching instruction signal in this embodiment is predetermined in accordance with a maintenance code of the printed circuit board 3. For example, data relating to thicknesses of metal films deposited on various printed circuit boards is pre-stored in a memory of the computer system 33 at memory locations according to the part numbers and the drawing numbers of the printed circuit boards, and an operator on the computer system 33 inputs a part number and a drawing number of a printed circuit board 3 being etched. In response to the input part number and drawing number, the computer system outputs an etching instruction signal including the thickness of the metal film of the printed circuit board 3, to the program controller 29.

Accordingly, if the part number and drawing number of a printed circuit board to be etched are input on the computer system 33, the etching apparatus 30a described above can automatically control the etching quantity suitable for the thickness of the metal film deposited on the printed circuit board, similarly to the etching apparatus in FIG. 14.

Figure 16:
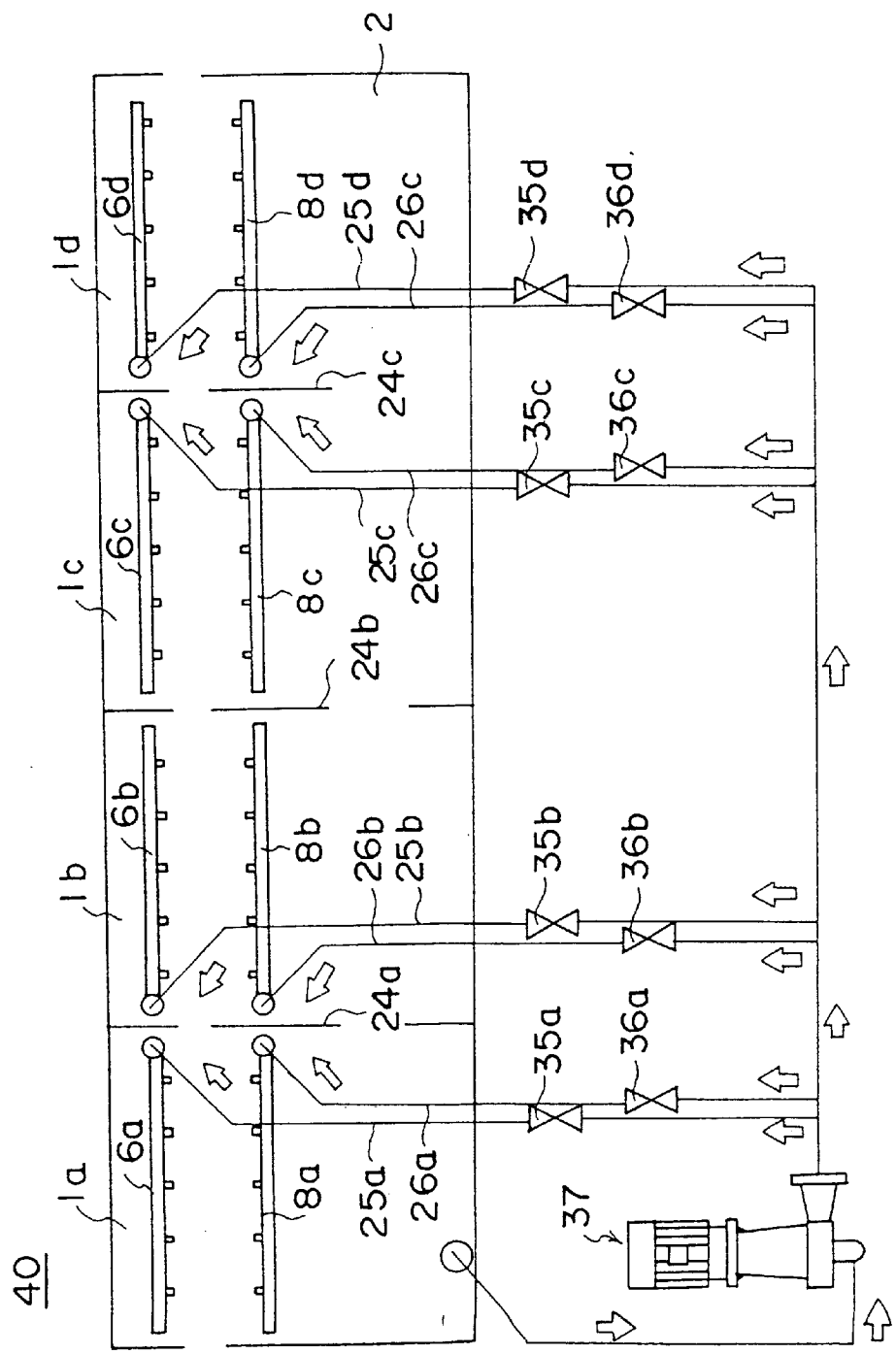
FIG. 16 is a diagram showing an etching apparatus in a twelfth embodiment of the present invention.
Figure 17:
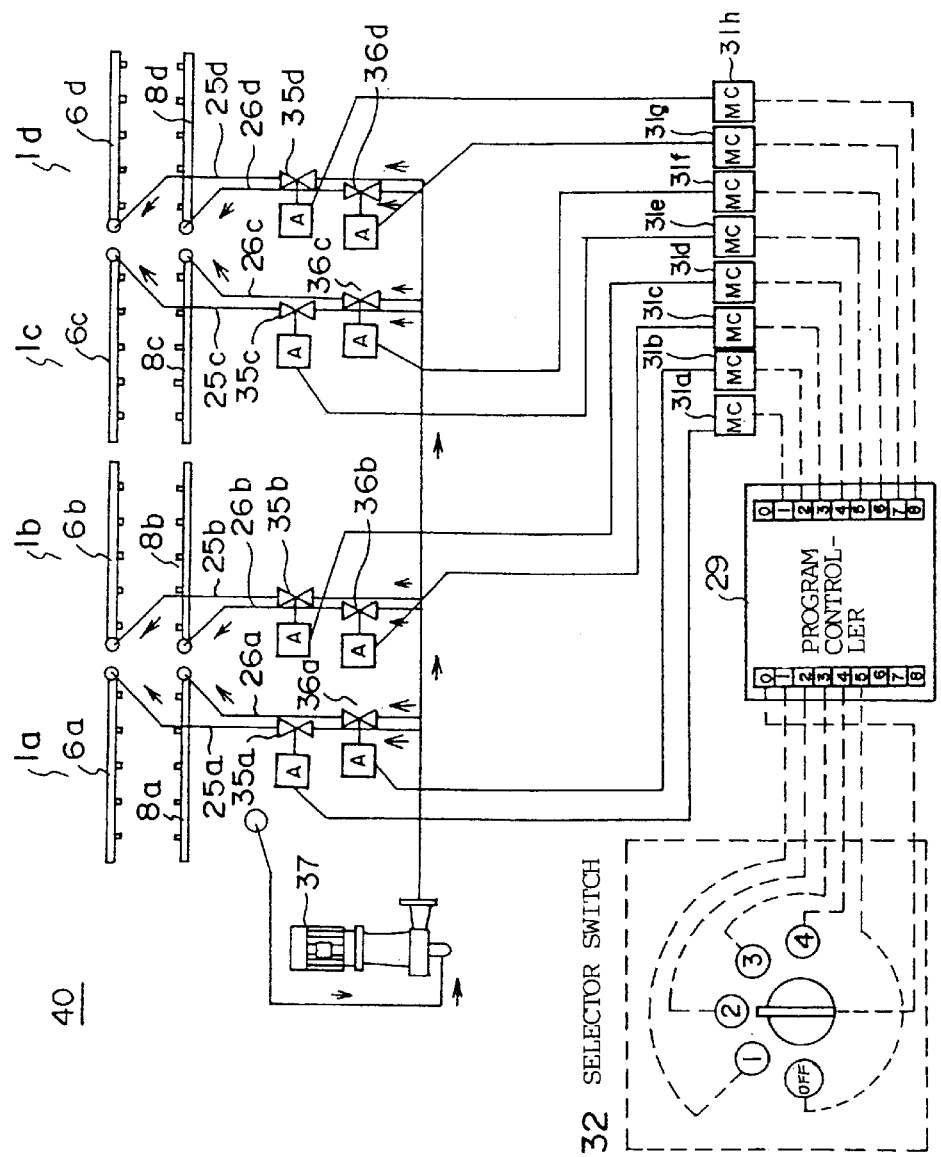
FIG. 17 is a system diagram showing the etching apparatus in FIG. 16.

FIG. 16 shows an etching apparatus 40 in a twelfth embodiment of the present invention. FIG. 17 is a system diagram showing the etching apparatus in FIG. 16. In FIGS.

16 and 17, the parts which are the same as corresponding parts shown in FIGS. 13 and 14 are designated by the same reference numerals, and a description thereof will be omitted.

In FIGS. 16 and 17, the etching apparatus 40 comprises a single spray pump 37, a set of first control valves 35a–35d respectively arranged in the connection pipes 25a–25d for adjusting the first flow rates of the etchant supplied to the respective sets of the upper spray pipes 6a–6d, and a set of second control valves 36a–36d respectively arranged in the connecting pipes 26a–26d for adjusting the second flow rates of the etchant supplied to the respective sets of the lower spray pipes 8a–8d. The etching apparatus 40 further comprises a program controller 29 which selectively sets the first control valves 35a–35d and the second control valves 36a–36d in accordance with an etching instruction signal, and a selector switch 32 which outputs an etching instruction signal to the program controller 29 in accordance with a position of the selector switch 32 set by an operator. The program controller 29 is connected to the first control valves 35a–35d and the second control valves 36a–36d via a set of magnet contacters 31a–31h similarly to the etching apparatus 30 in FIG. 14. The etching instruction signal is predetermined in accordance with a position of the selector switch 32.

In the twelfth embodiment described above, the first control valves 35a–35d and the second control valves 36a–36d which are arranged in the connecting pipes 25a–25d and in the connecting pipes 26a–26d respectively are controlled by the program controller 29 in accordance with the etching instruction signal, and it is possible to easily control the etching quantity suitable for various thicknesses of metal films deposited on various printed circuit boards if a position of the selector switch 32 is set by the operator, similarly to the etching apparatus 30 in FIGS. 13 and 14.

Figure 18:
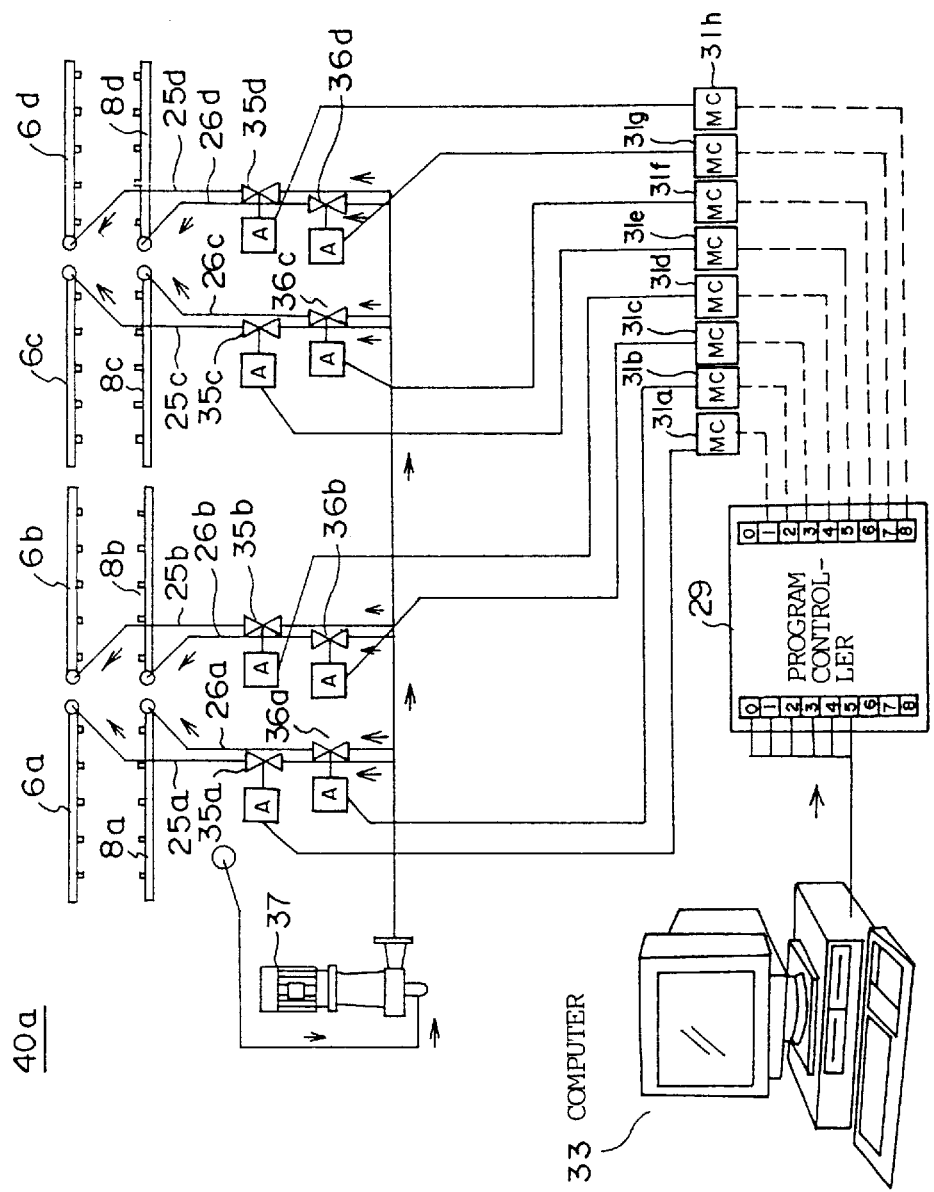
FIG. 18 is a system diagram showing a modification of the etching apparatus in FIG. 17.

FIG. 18 shows a modification of the etching apparatus 40 shown in FIG. 17. In FIG. 18, the parts which are the same as corresponding parts shown in FIG. 17 are designated by the same reference numerals, and a description thereof will be omitted.

In FIG. 18, an etching apparatus 40a includes a computer system 33, instead of the selector switch 32, and the computer system 33 outputs an etching instruction signal to the program controller 29 in accordance with a maintenance code of a printed circuit board 3 to be etched, which maintenance code is input by an operator on the computer system 33. Similarly to the etching apparatus 30a in FIG. 15, the etching instruction signal in this embodiment is predetermined in accordance with a maintenance code of the printed circuit board 3, and data relating to thicknesses of metal films deposited on various printed circuit boards is pre-stored in a memory of the computer system 33 at memory locations according to the part numbers and drawing numbers of the printed circuit boards. Therefore, the etching apparatus 40a in this embodiment can automatically control the etching quantity suitable for a thickness of a metal film deposited on the printed circuit board 3 to be etched if the part number and drawing number of the printed circuit board 3 are input on the computer system 33.

Figure 19:
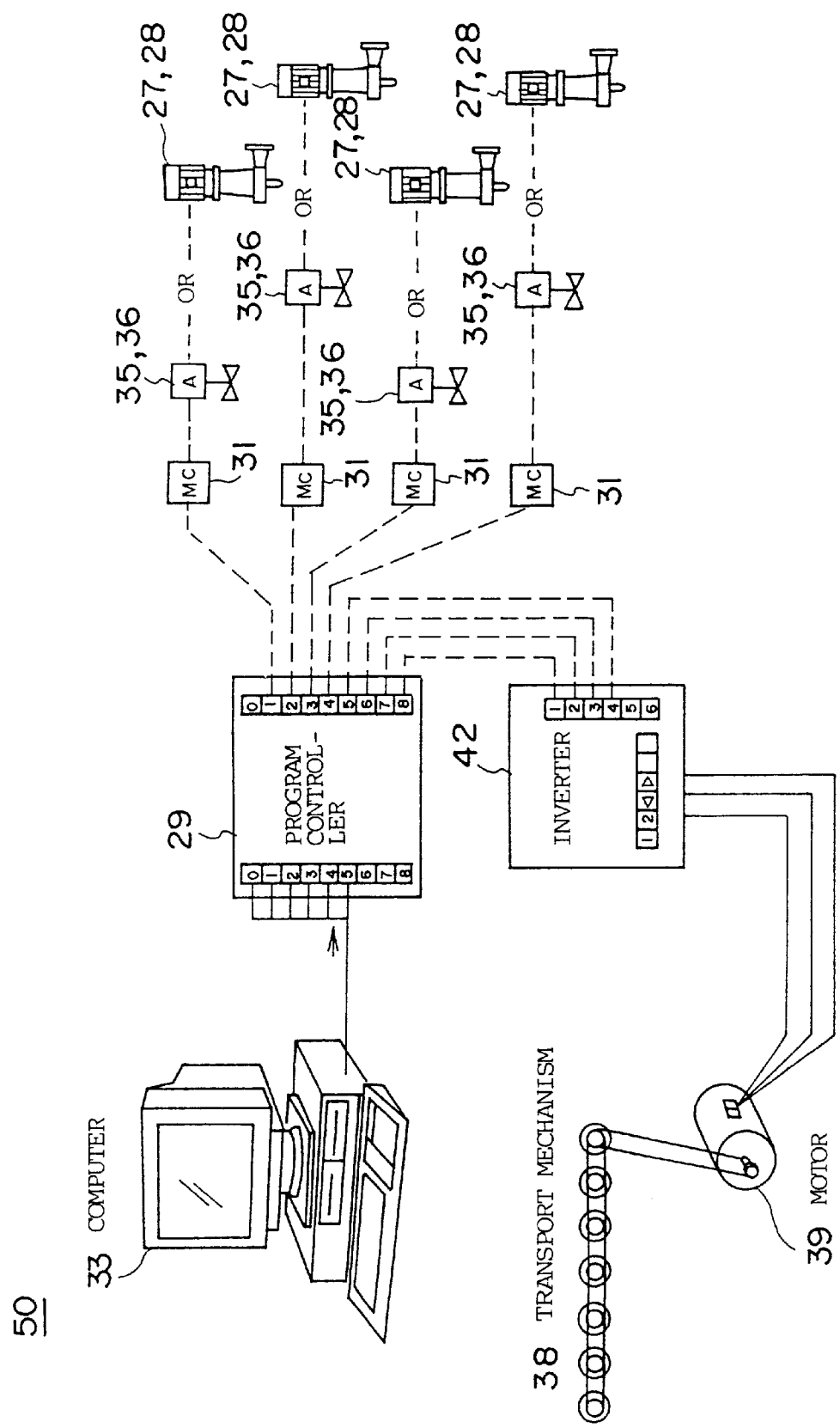
FIG. 19 is a system diagram showing an etching apparatus in a thirteenth embodiment of the present invention.

FIG. 19 shows an etching apparatus 50 in a thirteenth embodiment of the present invention. In FIG. 19, the parts which are the same as corresponding parts shown in FIGS. 13 through 18 are designated by the same reference numerals, and a description thereof will be omitted.

The etching apparatus 50 in this embodiment includes the first pumps 27a–27d for supplying the etchant to the upper spray pipes at the first flow rates and the second pumps 28a–28d for supplying the etchant to the lower spray pipes at the second flow rates, as in the etching apparatus 30a in FIG. 15. Alternatively, the etching apparatus 50 includes the first control valves 35a–35d for adjusting the first flow rates of the etchant supplied to the upper spray pipes and the second control valves 36a–36d for adjusting the second flow rates of the etchant supplied to the lower spray pipes, as in the etching apparatus 40a in FIG. 18.

In FIG. 19, the etching apparatus 50 comprises the computer system 33 which outputs an etching instruction signal, and the program controller 29 which selectively sets the first pumps 27a–27d and the second pumps 28a–28d in accordance with the etching instruction signal. Alternatively, the program controller 29 selectively sets the first control valves 35a–35d and the second control valves 36a–36d in accordance with the etching instruction signal.

The etching apparatus 50 further comprises an inverter 42 connected to outputs of the program controller 29, and a drive motor 39 connected to outputs of the inverter 42, and a transport mechanism 38 including the transport rollers 4 rotated by the motor 39. The program controller 29 outputs a transport control signal to the inverter 42 in accordance with an etchant instruction signal from the computer system 33, and the inverter 42 outputs a motor control signal to the motor 39 by processing the transport control signal output from the program controller 29. The speed of horizontally transporting a printed circuit board within the etching tank 1 by the transport mechanism 38 is adjusted in accordance with the motor control signal supplied to the motor 39. Therefore, in the etching apparatus 50, the transporting speed by the transport mechanism 38 is automatically controlled in accordance with the etching instruction signal output from the computer system 33.

Similarly to the etching apparatus 30a in FIG. 15, data relating to thicknesses of metal films deposited on the most-frequently used printed circuit boards is pre-stored in a memory of the computer system 33 at memory locations according to the part numbers and drawing numbers of the printed circuit boards. Therefore, if the part number and drawing number of a printed circuit board to be etched are input on the computer system 33, the etching apparatus 50 can realize the etching quantity suitable for a thickness of a metal film of a printed circuit board to be etched, and, at the same time, the etching apparatus 50 can realize the transporting speed of the printed circuit board by the transport mechanism which speed is suitable for the thickness of the metal film deposited on the printed circuit board. Thus, in the etching apparatus 50, it is possible to realize the etching of the printed circuit board with high accuracy of the etching quantity in accordance with the thickness of the metal film thereof.

FIG. 20 shows an etching apparatus 60 in a fourteenth embodiment of the present invention. In FIG. 20, the parts which are the same as corresponding parts shown in FIGS. 13 through 18 are designated by the same reference numerals, and a description thereof will be omitted.

In FIG. 20, the etching apparatus 60 comprises a non-contact type sensor 43 and a thickness measuring instrument 44, in addition to the computer system 33 and the program controller 29 described above in conjunction with FIGS. 13 through 18. The sensor 43 senses a thickness of a metal film such as copper deposited on a printed circuit board 3 to be etched, and outputs a measurement signal to the thickness measuring instrument 44. The thickness measuring instrument 44 converts the measurement signal, output from the sensor 43, into a thickness signal indicating the thickness of the metal film deposited on the printed circuit board 3. The program controller 29 receives the thickness signal output from the thickness measuring instrument 44, and selectively sets the first pumps 27a–27d and the second pumps 28a–28d (not shown in FIG. 20) in accordance with the thickness signal. Alternatively, the program controller 29 selectively sets the first control valves 35a–35d and the second control valves 36a–36d (not shown in FIG. 20) in accordance with the thickness signal.

In the fourteenth embodiment described above, it is possible to realize the etching quantity of the etching apparatus that is most suitable for a thickness of a metal film of a printed circuit board to be etched. Further, if the inverter 42 and the motor 39 shown in FIG. 19 are combined with the etching apparatus 60 in FIG. 20, it is possible to realize the transporting speed of the printed circuit board that is most suitable for the thickness of the metal film of the printed circuit board. Therefore, in the etching apparatus 60, it is possible to realize the etching of the printed circuit board with a very high accuracy of the etching quantity in accordance with the thickness of the metal film thereof.

Further, the present invention is not limited to the above described embodiments, and variations and modifications may be made without departing from the scope of the present invention.

What is claimed is:

1. An apparatus for etching a printed circuit board, comprising:

transporting means for horizontally transporting a printed circuit board in a transporting direction so that a height of said printed circuit board during etching is kept at a transport position;

a plurality of upper spray nozzles for injecting an etchant to a top surface of said printed circuit board transported by said transport means;

a plurality of lower spray nozzles for injecting an etchant to a bottom surface of said printed circuit board; and a plurality of ejecting passages for ejecting the etchant, injected to the top surface of the printed circuit board by the upper spray nozzles, away from the printed circuit board in transverse directions perpendicular to the transporting direction of the printed circuit board, wherein the ejecting passages are arranged at portions of the transport means in which no pressure rollers are provided at locations corresponding to the ejecting passages.

2. An apparatus according to claim 1, wherein said transport means comprises a plurality of longitudinally arranged transport rollers which are rotated to transport the printed circuit board in the transporting direction in contact with the bottom surface of the printed circuit board, and a plurality of longitudinally arranged pressure rollers which are opposed to said transport rollers and exert pressure onto the printed circuit board against said transport rollers in contact with the top surface of the printed circuit board, and wherein said ejecting passages are arranged at portions of said transport means where only transport rollers corresponding to said portions are arranged and no pressure rollers opposed to said transport rollers are arranged.

* * * * *